United States Patent [19]
Bertin et al.

[11] Patent Number: 5,880,988
[45] Date of Patent: Mar. 9, 1999

[54] REFERENCE POTENTIAL FOR SENSING DATA IN ELECTRONIC STORAGE ELEMENT

[75] Inventors: Claude Louis Bertin, So. Burlington; John Atkinson Fifield, Underhill; Russell James Houghton, Essex Junction; Christopher Paul Miller, Underhill; William Robert Patrick Tonti, Essex Junction, all of Vt.

[73] Assignee: International Business Machines Corporation, Armonk, N.Y.

[21] Appl. No.: 893,797

[22] Filed: Jul. 11, 1997

[51] Int. Cl.[6] ........................................... G11C 5/06
[52] U.S. Cl. .................. 365/63; 365/185.2; 365/185.25; 365/104
[58] Field of Search .............................. 365/149, 63, 203, 365/233, 104, 189.01, 189.02, 185.25, 185.2

[56] References Cited

U.S. PATENT DOCUMENTS

| | | | |
|---|---|---|---|
| 4,413,330 | 11/1983 | Chao et al. . | |
| 4,598,387 | 7/1986 | Chuang et al. | 365/149 |
| 4,807,195 | 2/1989 | Busch et al. . | |
| 5,138,579 | 8/1992 | Tatsumi et al. | 365/203 |
| 5,355,333 | 10/1994 | Pascucci . | |
| 5,367,481 | 11/1994 | Takase et al. | 365/149 |
| 5,572,459 | 11/1996 | Wilson et al. . | |
| 5,682,343 | 10/1997 | Tomishima et al. | 365/63 |

*Primary Examiner*—David Nelms
*Assistant Examiner*—Thong Le
*Attorney, Agent, or Firm*—Schmeiser, Olsen & Watts; Robert A. Walsh

[57] ABSTRACT

A column of an integrated memory circuit includes two bit lines each with a right half and a left half and a plurality of similar memory cells connected to each half of each bit line. One of the memory cells connected to each line is used as a reference and the other cells are used for data storage. Each half of each bit line is connected to a sense node of a sense amplifier latch through an independently controlled transistor switch. To read the data from the first half of the first bit line, the transistors connecting the first half of the first bit line to the sense node is turned on and the transistor connecting the second half of the first bit line to the sense node is turned off. Both transistor switches connecting respective halves of the other bit line to the other sense node are turned on. Each half of each bit line includes approximately the same effective load. The load applied to the first sense node is thus about half of the load applied to the second sense node. Access switches are opened to access the value stored in the data memory element and the reference data element and the resulting potential in the bit lines are significantly different whether the same value is stored or not, due to the different loads. Preferably, the output of the memory elements is selected so that the reference potential is about midway between the potential in a bit line half connected to a memory element storing a high value and a low value.

14 Claims, 15 Drawing Sheets

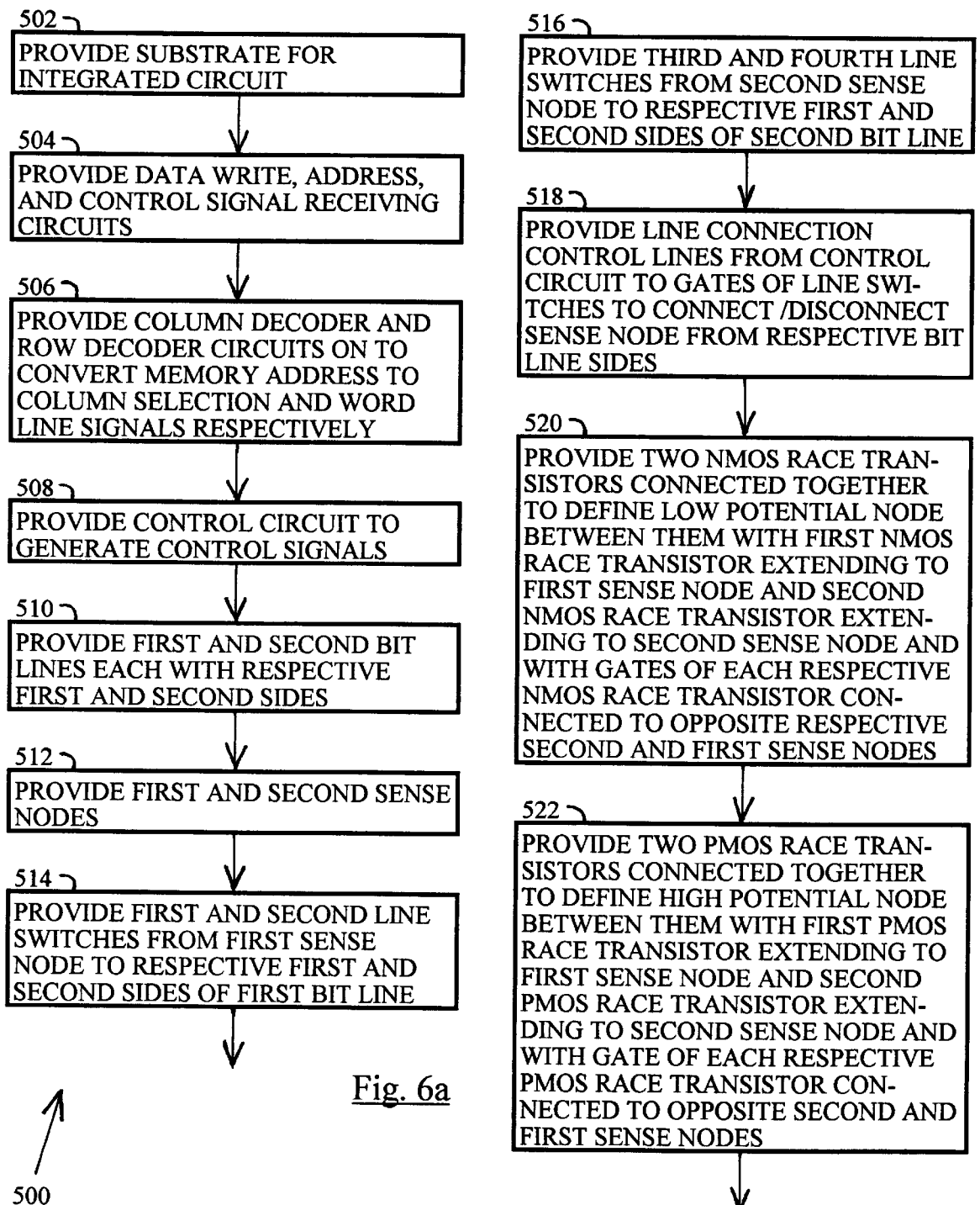

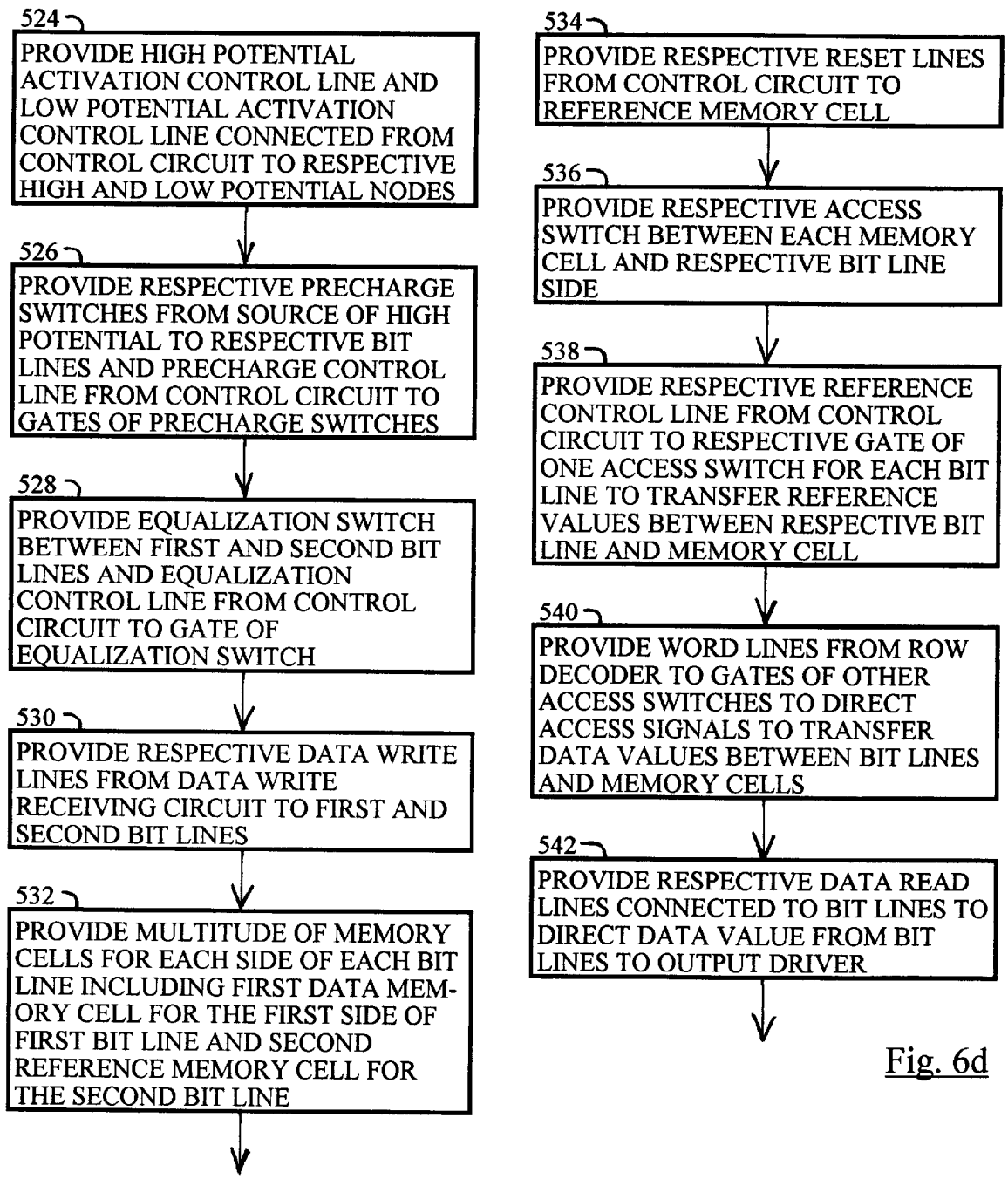

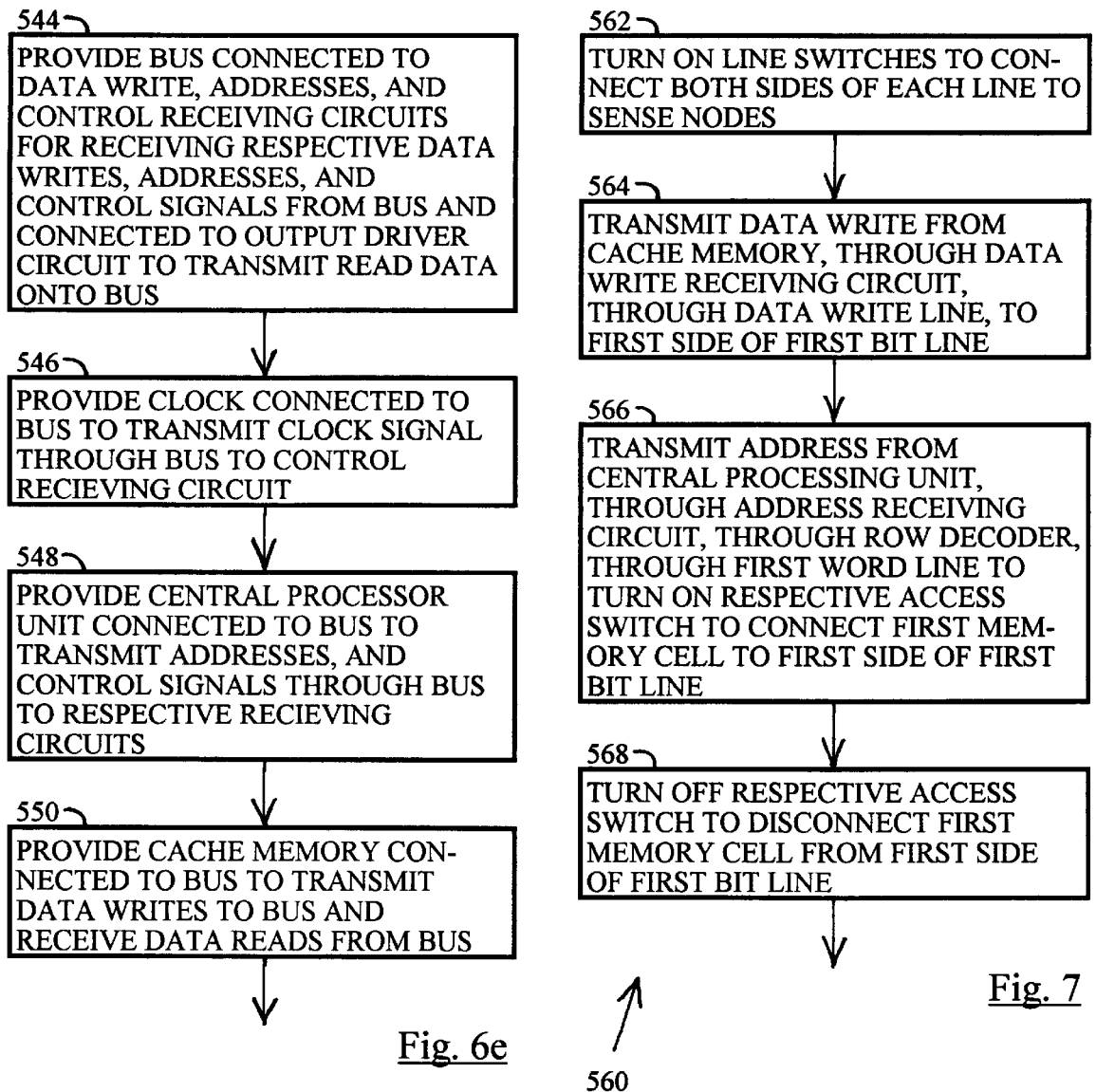

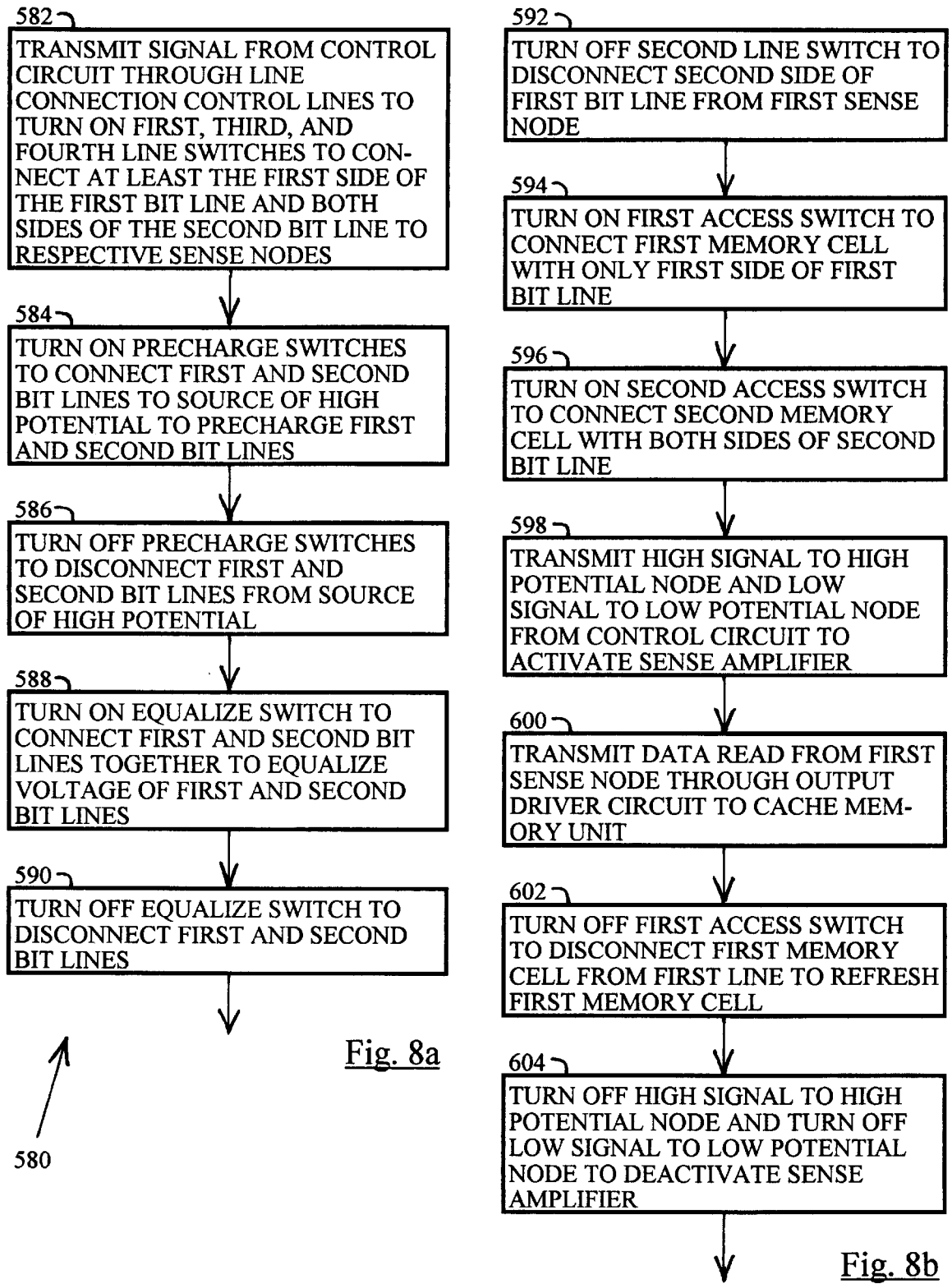

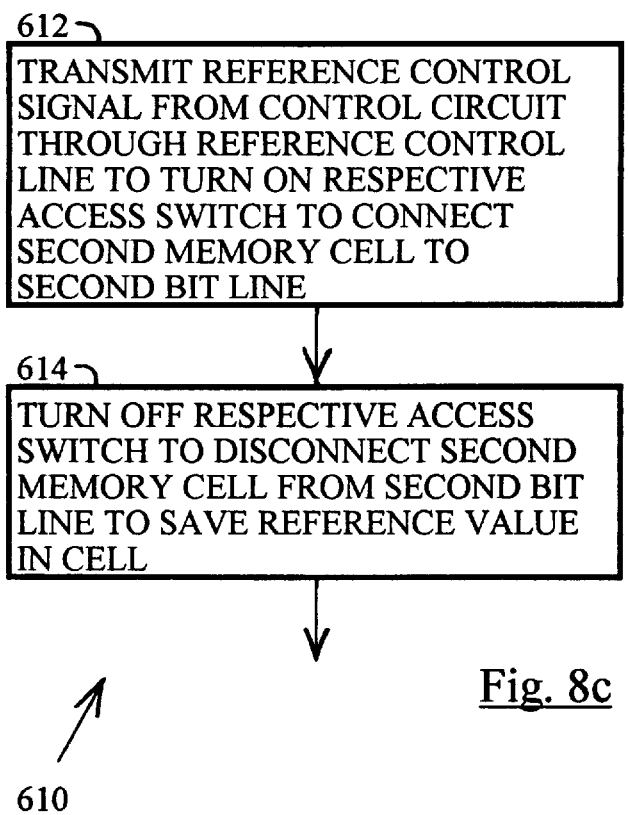

REFERENCE POTENTIAL FOR SENSING DATA IN ELECTRONIC STORAGE ELEMENT

FIELD OF INVENTION

This invention relates to digital computers and more specifically, data storage and retrieval in electronic memory of such computers. This invention most closely relates to integrated electronic memory circuits in which a sense amplifier compares the potential of a bit line connected to a data storage cell with the potential of another bit line connected to a reference storage cell.

BACKGROUND OF THE INVENTION

The development of the EDVAC computer system in 1948 is often cited as the beginning of the computer era. Since that time, computers have become indispensable in many fields of human endeavor including engineering design, machine control, process control, and information storage and access. Each computer includes processing units, memory units, a means for receiving input signals and a means for transmitting output signals. Computers used as workstations also include apparatus for user input such as a keyboard and mouse, and apparatus for providing information to the user such as a display screen and a printer. The memory provides instruction signals and other data to the processor to control the operation of the computer. The data is transmitted between the memory and processor through multiple parallel wires called a bus. The processor executes the instruction signals and transmits at least some of the resulting data signals back to the memory for storage.

In digital computers, data is processed and stored in binary form. Binary refers to a number system in which all digits are either 0 or 1. Signals are usually transmitted within the computer as voltage levels. For example, a low potential such as 0 volts may be used as a zero and a higher potential such as 3 volts may be used as a one. Data signals are stored in computer memory using static switches (transistor states or capacitive charges) called bits that are set to either on or off (or high or low) to represent either 0 or 1. Since numbers in a digital computer are transmitted in binary form and stored in switches that are either on or off, the use of binary numbers results in a simpler design, more efficient storage, and faster operation than a computer based on decimal numbers.

For example, decimal one (1d) may be stored as binary 0001 (1b) and decimal two (2d) is stored as binary 0010 (10b); and thus 3d is stored as 0011b (2d+1d). Similarly, since 4d is stored as 100b, then 7d (4d+2d+1d) is stored as 0111b.

The storage of data signals in computer memory is known as "writing to the memory", and the generation of data signals by the computer memory is known as "reading from the memory". When data is written to memory, the switches are set to represent the numeric value of the data that is written and then the data signals can be read from the memory by detecting the settings of the switches and generating corresponding data signals. The bits are grouped together into bytes consisting of 8 bits and words, or cells of 2, to 8 bytes to form one or more larger numbers. Characters (letters, numerals, punctuation marks, symbols) are represented by numbers (e.g. 0–255) that can be stored in one byte.

In early computers, a type of memory known as core was used. This consisted of individual rings (cores) of ferrite in an array connected by wires to electronic writing and sensing circuits. Data was stored by applying a current to set the magnetic polarity of one of the rings. The polarity of the magnetic field of each ring represented either a zero or a one. In modern computers the use of core memory has been replaced by transistor and capacitance based electronic memory.

There are several common types of electronic memory used in computer systems. Dynamic memory is a type of memory which must be refreshed. Refreshing consists of reading the value in the memory and then writing the same value to the memory. Dynamic memory usually consists of capacitive elements (gates of FETs or capacitors) that can be isolated or accessed using transistor switches. Static memory is another common type of memory. Static memory does not have to be refreshed. The stored values remain in storage as long as the memory is receiving electrical power. Static memory usually consists of several transistors forming a circuit which can be switched to operate in either of two stable states.

Permanent memory (non-volatile memory) is a type of memory which does not require external power to maintain data. The permanent memory may be manufactured with connections and opens that can not be changed (known as read only memory ROM); or the permanent memory may be programmable once using high voltages to burn out connections to form opens (programmable read only memory PROM); or the PROM may be bulk re-writable using ultraviolet light or high currents applied to one pin to erase the entire memory of the chip and written by applying a high voltage signal to charge floating gates to write data; or the permanent memory may be electrically re-writable such as electrically erasable PROM (EEPROM) in which each word may be individually rewritten. For example, low power static or dynamic memory may be made permanent by including batteries in the package with the memory. Flash memory is another common type of permanent memory which uses ferromagnetic capacitors to store charges. The flash memory is written by a higher potential difference, and when read outputs a lower potential difference.

Previous patents related to electronic memory include U.S. Pat. Nos. 5,572,459 to Wilson, 4,598,387 to Chuang, and 5,367,481 to Takase all of which are herein incorporated in whole, by reference.

SUMMARY OF THE INVENTION

In a first aspect of the invention of Applicants, an integrated circuit includes first and second halves of a first line. Each half is connected to a first node through respective first and second transistor switches. The circuit also includes first and second halves of a second line, each connected through respective third and fourth transistor switches to a second node. Each bit line half provides a substantial effective load to the respective node. A data storage element (memory cell) is connected to the first half of the first bit line and a reference storage element is connected to the first half of the second bit line through respective read access switches.

The integrated circuit includes control means to turn on (connect through) the first, third and fourth transistor switches, and turn off (disconnect) the second transistor switch so that the effective load connected to the first node is substantially smaller than (e.g. half) the effective load connected to the second node. Then when the respective read access switches (connecting the data storage element and reference storage element to the bit lines) are turned on, the potentials at the first and second nodes become substantially different due to the difference in effective loads. If a high (logic 1) was stored in the data storage element and a low (logic 0) was stored in the reference storage elements then the potential of the first node becomes substantially higher than the potential of the second node. Also, if the lines are precharged to a high potential, and a low value is stored in the data storage element, and a low was stored in the reference storage element, then the potential of the first node becomes substantially lower than the potential of the second node due to the difference in the loads.

This invention provides a simple circuit that allows a weighted comparison between the value stored in the data storage element and the value stored in the reference storage element.

In a second aspect of the invention of Applicants, a computer system includes a data memory cell (storage element) connected to a first circuit connected to a first node and a reference storage cell that is connected to a second circuit that is connected to a second node. The data and reference storage cells have essentially identical component dimensions, but the circuits provide different effective loads so that when the same value is read from both the data and reference storage cells the potential developed at the first node is significantly different than the potential developed at the second node due to the difference is loads.

For example, if both bit line circuits are precharged to a high potential, and a low value is read from both the data and reference cell, then the potential of the first circuit is reduced more than the potential of the second circuit. When the circuits are precharged to a high potential, and a high value is read from the data cell and a low value is read from the reference cell, then the potential in the first node remains at the high level while the potential in the second node decreases to a lower level. In either case the difference in potential between the nodes is sufficient such that the comparator can reliably distinguish the value stored in the data storage cell from noise.

This second aspect allows the storage cells to be manufactured with the minimum dimensions for which data can be reliably distinguished from noise. The reference cell does not have to have smaller dimensions in order to develop a lower reference potential at the second node compared to the first node when the same high value or same low value is stored in both the reference and storage cell. This allows the same potential to be used to store a high value in both the storage cell and the reference cell. Thus circuitry required to provide two different potentials for the same value can be eliminated. Also, the reference storage cell can be manufactured essentially identically to the data storage cell with the same dimensions by the same process.

In a third aspect of the invention a first memory unit includes a data storage cell connected to a pair of essentially, electronically identical circuits and a second memory unit connected to a third essentially, electronically identical circuit.

This third aspect allows much easier layout of the integrated circuit comprising of repeated copies of essentially the same circuits. Also, the resulting circuits tend to provide highly reproducible potential levels to the sense amplifier.

The invention further comprises the combination of the first, second, or third aspect above with the following additional advantageous aspects.

The integrated circuit includes a comparator connected to the first and second nodes to compare the potential at the first and second nodes and provide a signal depending on the comparison. The circuit of the invention can be used for an element of a memory unit. The different loads provided by the first half of the first line and the second line are sufficiently different such that the comparator can determine a value stored in the data storage element. That is, if the lines are precharged to a low value and a high value is read from the data and reference storage elements then the potential of the first node is sufficiently higher than the potential of the second node so that the comparator can reliably detect the difference and provide a signal indicating that a high was stored in the data storage element. Also, if the lines are precharged to a high value and a low value is read from both the data and reference storage elements then the potential of the first node is sufficiently lower than the potential of the second node so that the comparator can reliably detect the difference and provide a signal indicating that a low was stored in the data storage element.

The comparator is a CMOS sense amplifier connected in race mode configuration. This allows the comparator to detect small differences between the potential of the first and second nodes. Each node is connected to a source of controlled high potential through a PMOSFET transistor and connected to a controlled source of low potential through NMOSFET transistors. This configuration allows immediate refreshing of the data storage at the full potential of a high value through a bit line even when the other bit line is pulled low, and cross capacitance coupling between the bit lines would otherwise decrease the value of the bit line below full high potential.

A significant portion of the loads of the first and second circuits are capacitive and the integrated circuit includes means to precharge the circuits to a potential that is different (logically opposite) than the value read from the reference storage element prior to turning on the read switches. For example, if a low value is read from the reference cell, then the line is precharged to a high value.

The effective capacitance of one of the storage elements is sufficiently high to allow sensing a potential difference due solely to the difference between connecting half a bit line and both halves of a bit line to respective sense nodes. More preferably, for dense memories, the effective capacitance of the storage elements may be between 0.1 and 0.2 times the effective capacitance of one of the bit lines. For embedded memories, the effective capacitance of one of the storage elements may be between 0.2 and 1.0 times the effective capacitance of one of the bit lines. The effective capacitance may be defined as twice the charge transferred before the data is sensed divided by the time between turning on the access switch and sensing the data when the bit line was precharged to a logically opposite value to the value read from memory onto the bit line.

The integrated circuit includes means to equalize the potential in the first half of the first line and the second line before the read access switch is turned on. This allows the comparator to more quickly and reliably determine the value in the data storage element.

A multitude of additional data storage elements are connected to each half of each bit line through respective transistor access switches (such as a FET transistor or bipolar transistor). The reference storage cells are identical to the data storage cells and at least one reference storage cell is connected to at least one side of each bit line. The plurality of FET access switches that are turned off result in a capacitive load on each bit line half that is far higher than the load resulting from the line switches.

The memory elements are simple one transistor ROM or RAM storage elements and the circuit includes refresh circuitry to refresh the data and reference storage elements to the original value before the read operation.

Additional alternatives and advantages of the invention will be described or become obvious from the detailed description of the following drawings:

BRIEF DESCRIPTION OF THE DRAWINGS

FIGS. 6a–6e is a flow diagram of the process of the invention for providing the portion of the memory array column of FIG. 3.

FIG. 7 is a flow diagram of the process for writing data to the portion of the memory array column in FIG. 3.

FIGS. 8a–8b are flow diagrams of the process for reading data from the portion of the memory array column of FIG. 3.

FIG. 8c is a flow diagram of the process for setting the reference value stored in a DRAM memory cell.

DETAILED DESCRIPTION OF THE DRAWINGS

Figure 1:
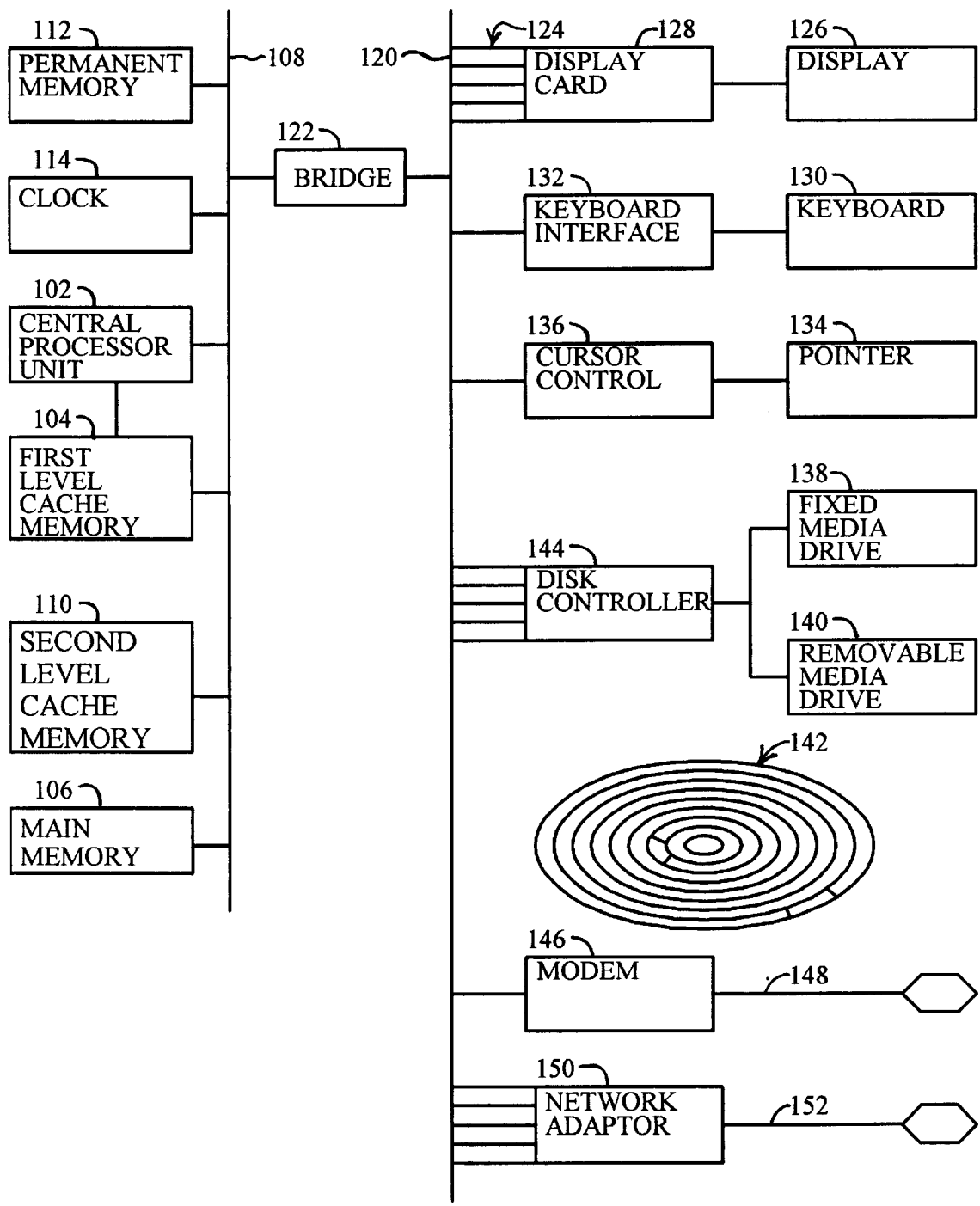
FIG. 1 is a schematic block diagram of the computer system of the invention.

FIG. 1 illustrates a specific embodiment of a computer 100 implementing the inventions herein. A central processor unit 102 (CPU), cache memory 104, and main memory 106 communicate through processor bus 108. The CPU and cache memory may each be separately connected to the processor bus, and/or the CPU may be connected through the cache memory as shown, or an additional second cache 110 may be connected to the processor bus. A portion of the cache may be integral with the CPU (embedded in the CPU) and a portion may be implemented as independent static random access memory (SRAM) units. The cache memory operates much faster than the main memory, but is much smaller. Frequently used code and data are copied from portions of the main memory into the cache to provide faster access to the code or data. A small programmed permanent memory 112 may be connected to the processor bus with an initialization program to load other programs into main memory at system start-up (i.e. to boot-up the computer). The permanent memory may be read only memory (ROM), electrically erasable programmable read only memory (EEPROM), flash memory, or battery backed SRAM. Clock 114 provides control signals to the central processor unit and memory units and other units of the computer system synchronous communication.

The integrated circuit inventions of this application are used to implement the main memory 106, cache memory 104 and 110, and permanent memory 112 of this computer system as described below. Also, this invention may be utilized as embedded memory such as cache integrated with the central processor, cache in disk drives or disk drive controllers and register or buffer memory in the memory units, processor, or other computer peripherals described below such as the display card, bridge, modem, network adaptor. Furthermore, the invention may find use in other portions of the computer system where signals are compared to reference signals including applications not related to electronic memory.

Input/output (I/O) bus 120 may be interconnected with processor bus 108 by bridge 122. The I/O bus preferably operates at a slower speed than the processor bus and includes card slots 124 for connecting adaptor cards. The system may also provide a second high speed I/O bus (not shown) or may provide connections (not shown) for high speed adaptor cards directly on the processor bus. Display 126 is connected to display card 128 which is inserted into a card connector 124 of the I/O bus. The display may be a liquid crystal display (LCD) which is preferred when the computer is a palmtop or laptop system, or the display may be a cathode ray tube (CRT) display which is preferred when the computer is a desktop model. Keyboard 130 is connected to keyboard interface 132 which is connected to the I/O bus. The keyboard allows the user to input data. Pointer 134 (e.g. mouse, joy stick, track ball) is connected to cursor control 136 which is connected to the I/O bus. The pointer allows the user of the computer system to position a cursor at a selected location on the screen of the display.

Storage is a type of computer memory which is much larger and provides much slower access than the main memory of the computer system. The storage usually comprises magnetically or optically programmed media which is rotationally driven relative to a read or read/write mechanism in order to generate input signals or store output signals. Drive 138 includes fixed media (i.e. the media is not easily removed from the drive) and drive 140 allows removable media 142 to be inserted into drive 140 in order to generate input signals or store output signals and allows the removable media to be subsequently taken out of the drive. Some fixed media drives may be easily removed from the system and replaced. Media 142 may be magnetic media such as a floppy disk, hard disk, or magnetic tape or the media may be optical media such as a CD-ROM, or the media may be opto-magnetic media. The drives 138 and 140 are connected to disk controller 144 which is connected to the I/O bus.

Modulator/Demodulator (MODEM) 146 may be inserted into another card connector of the I/O bus. An analog or digital (ISDN) phone line 148 (or cellular radio) may be connected to the modem for communication with another remote computer systems or a host. Network adaptor 150 is inserted into another card connector of the I/O bus. The network adaptor may communicate with other computer systems through network cable 152 (e.g. twisted copper wires, coaxial cable or optic fiber) or may communicate by radio or infrared or other means.

Figure 2:
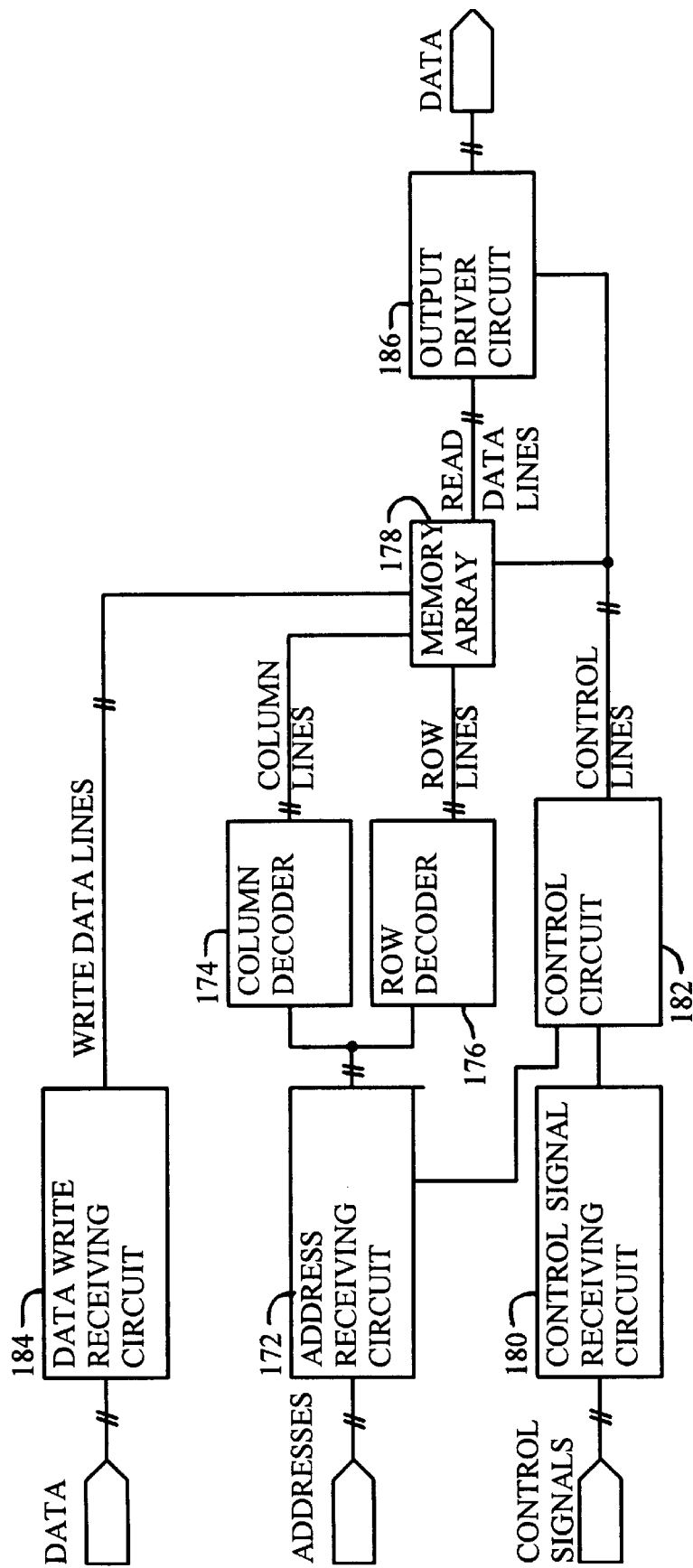
FIG. 2 is a schematic block diagram of a portion of the main memory of FIG. 1 showing the integrated memory circuit of the invention.

FIG. 2 illustrates memory unit 170 of the invention. The memory unit may include dynamic memory cells or static memory cells or a permanent memory cells. The memory unit may be a portion of a main memory unit, permanent memory unit, or cache memory unit. Also, the memory may be embedded memory in another unit of the computer system such as the central processor, modem, video card, network adaptor, disk controller, or disk drive or some other part of the computer system. Address signals are received through an address bus, from another computer unit such as the central processing unit (102 in FIG. 1) or a portion thereof, into address receiving circuit 172. The address is converted into a column line signal and a row line signal (word line signal) using decoder units 174 and 176 respectively. The row lines and column lines are used to access an array 178 of memory elements described in more detail below.

The memory elements may be accessed to write data or to read data from the memory array. Control signals including a clock signal are received from the central processing unit and clock (102 and 114 in FIG. 1), through a control bus into control signal receiving circuit 180. A control circuit 182 generates control signals for accessing the memory array and controlling the output of the data, depending on the control signals received by circuit 180. In the case of programmable memory, data is received from a processor unit or another memory unit, through a data bus, into data write receiving circuit 184. Data which is read from the memory array is transmitted to an output driver circuit 186 which may be controlled by the control circuit 182, and which transmits the data through the data bus to another memory unit or processor unit such as an I/O card.

Figure 3:
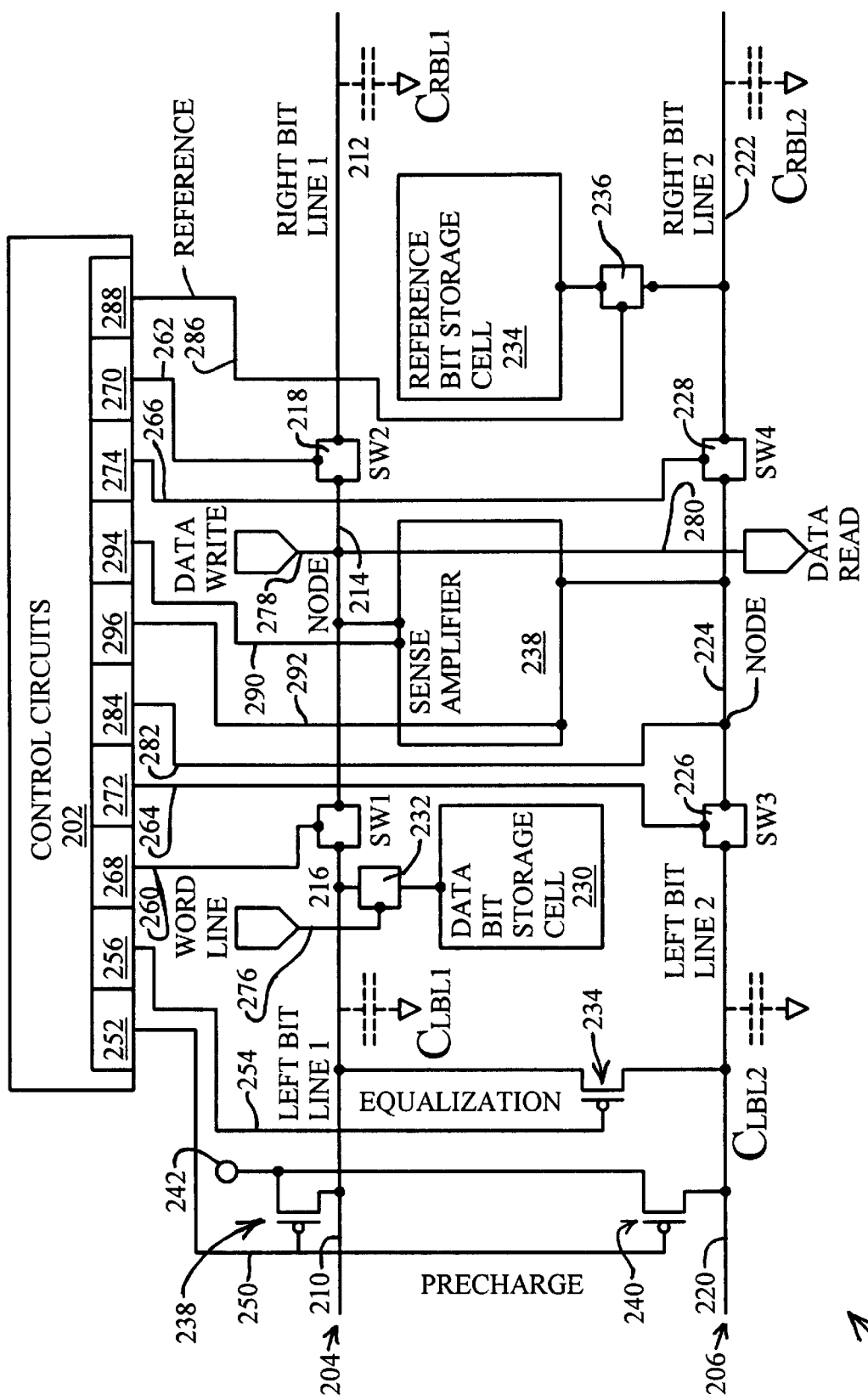
FIG. 3 is a schematic block diagram of a portion of a column of the memory array of FIG. 2 showing selected details.

FIG. 3 shows a simplified schematic of a portion of a column 200 of a memory array (such as array 178 in FIG. 2) of a specific embodiment the invention, and shows a portion 202 of control circuit 172 of FIG. 2. The portion of the column includes a first bit line 204 and a second bit line 206. The first bit line includes left side 210 and right side 212 connected to first node 214 by transistor switches 216 and 218 respectively. Switches 216 and 218 are labeled SW1 and SW2 respectively. The second bit line 206 includes left side 220 and right side 222, and each side is connected to second node 224 by transistor switches 226 and 228 respectively. Switches 226 and 228 are labeled SW3 and SW4 respectively.

Data bit storage cell 230 is connected to the left side of bit line 1 through access switch 232, and reference bit storage cell 234 is connected to bit line 2 through access switch 236. Sense amplifier 238 is connected to both first node 214 and second node 224. Equalizing switch 234 is connected between the first bit line and second bit line. Precharge switches 238 and 240 connect between a source of high potential 242 and the first and second bit lines respectively.

Preferably, the effective bit line load CLBL1, CRBL1, CLBL2, and CRBL2 are all approximately equal. A precharge line 250 is connected to precharge control circuit 252 of the control circuit 202 to precharge the bit lines 204, 206 before reading from the cells. Precharging is required for some types of memory cells such as gain cells and DRAM cells, but is not required for other types of memory cells such as SRAMs. Alternatively or additionally, an equalization line 254 may be connected to an equalization control circuit 256 of the control circuit 202 to equalize the potential in the bit lines before reading. Switch control lines 260, 262, 264 and 266 are connected to first, second, third, and fourth switch control circuits 268, 270, 272, 274 respectively to independently control the settings of switch transistors 216, 218, 226, and 228 respectively.

A data word line 276 is connected from one of the decoders of FIG. 2 to select a data bit storage cell in the column or portion 200. A data write line 278 extends from the data write receiving circuit (184 in FIG. 2), and a data read line 280 extends to the output driver circuit (186 in FIG. 2), to direct data respectively, into and out of the memory array column. A reference write line 282 connected to a reference write circuit 284 of the control circuit 202, directs a reference value to bit line 206 for setting the reference bit storage cell 234. A reference access line 286 connects from reference access control circuit 288, to direct a reference access control signal to the gate of switch 236, in order to control the connection/disconnection of the reference bit storage cell 234 with the second bit line 222. Refreshing the reference cell through the bit lines allows the reference storage cell and data storage cells to be identical. More preferably, the reference write line 282 is connected directly to the reference storage cell. This allows refreshing the reference value either at the end of the read cycle or during precharging, regardless of the potential of the second bit line.

A high potential sense activation line 290 and a low potential sense activation line 292 are connected to high sense activation circuit 294 and low sense activation circuit 296 respectively in order to control the activation of the sense amplifier 238. The activation lines are switched from a high impedance state to a conducting state and the potential is slowly changed until the potential difference between node 1 and node 2 is detected, and then the potential is more quickly changed to a high potential for line 290 and a low potential for line 292 to amplify the difference.

Figure 4:
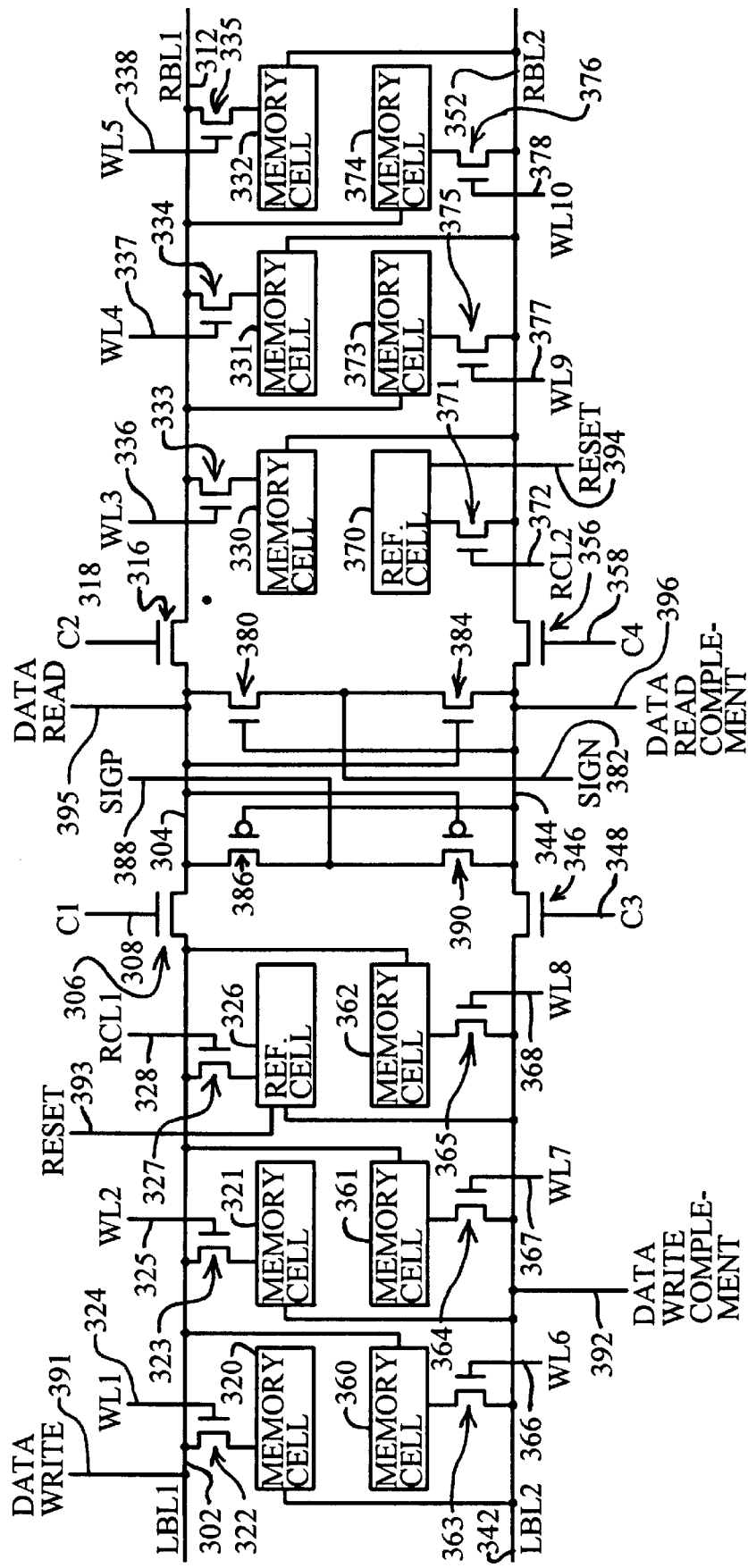
FIG. 4 is another schematic block diagram of the portion of a column of the memory array of FIG. 2 showing other selected details.

FIG. 4 shows a simplified schematic of a portion of a column 300 of a memory array (such as that of FIG. 2) of the invention including details that are not shown in FIG. 3. Also, some details shown in FIG. 3 are not included in the embodiment of FIG. 4 in order to simplify FIG. 4.

For bit line 1, the left bit line half 302 is connected to first node 304 of a sense amplifier through transistor 306. The gate of transistor 306 is connected to control line 308. Also, for bit line 1, the right bit line half 312 is connected to node 304 of a sense amplifier through transistor 316. The gate of transistor 316 is connected to control line 318. Memory cells 320 and 321 are connected to left half bit line 302 through switches 322 and 323 respectively, and the gates of the switches are connected to control lines 324 and 325 respectively. Reference cell 326 is connected to the left half bit line 302 through switch 327, and the gate of the switch is connected to control line 328. Memory cells 330, 331 and 332 are connected to right half bit line 312 through switches 333, 334, and 335 respectively, and the gates of the switches are connected to control lines 336, 337, and 338 respectively.

Similarly for bit line 2, the left bit line half 342 is connected to second node 344 of a sense amplifier through transistor 346. The gate of transistor 346 is connected to control line 348. Also, for bit line 2, the right bit line half 352 is connected to node 344 of the sense amplifier through transistor 356. The gate of transistor 356 is connected to control line 358. Memory cells 360, 361, and 362 are connected to left half bit line 342 through switches 363, 364, and 365 respectively, and the gates of the switches are connected to control lines 366, 367, and 368 respectively. Reference cell 370 is connected to the right half bit line 352 through switch 371, and control line 372 is connected to the gate of switch 371. Memory cells 373 and 374 are connected to right half bit line 352 through switches 375 and 376 respectively, and the gates of the switches are connected to control lines 377 and 378 respectively.

Preferably, the line switches 306, 316, 346 and 356 are MOSFET transistors either PMOS or NMOS. Also, the access switches 322–323, 327, 333–335, 363–365, 371, and 375–376, are preferably, MOSFET transistors either PMOS or NMOS. The memory and reference cells are preferably all of the same type and have substantially the same dimensions or produce substantially the same output when connected to substantially the same loads. Preferably, only one of the cells for each bit line are used as reference cells and the other cells are used to store data. The memory cells may be DRAM, SRAM, flash memory, register memory or other types of cells. The invention is especially useful with cell types that require a reference value to achieve their highest speeds. For example, some types of gain cells, when fabricated with minimum dimensions, produce low currents when a low value is read, and do not produce currents when a high value is read. Such gain cells can be operated at low speed without any reference or external amplifier, but they can be operated at much higher speeds in combination with a reference cell and sense amplifier.

Memory cells 326 and 370 are used to store reference values and the other memory cells are used to store data values. Control lines 324–325, 336–338, 366–368, and 377–378 are word lines extending from address decoders and are labeled WL1–WL10 respectively. Lines 328 and 372 are reference control lines labeled RCL1 and RCL2 respectively.

The sense amplifier includes a first race switch 380 connected between first node 304 and a low sense activation signal line 382 and a second race switch 384 connected between the second node 344 and line 382. Preferably, the sense amplifier also includes a third race switch 386 connected between second node 344 and a high sense activation signal line 388 and a fourth race switch 390 connected between the second node 344 and line 388. First and second race switches 380 and 384 are preferably, N-type MOSFETs, and third and fourth race switches 386 and 390 are preferably, P-type MOSFETs.

To each bit line, a data write line 391 and complement data write line 392 are connected. Reset lines 393 and 394 are connected directly to the reference memory cells to allow resetting during precharging or equalization of the bit line potentials. Since only one side of the bit line is connected to the respective sense node during data reading, then either a respective data read lines 395 and 396 may be connected to each sense node (as shown), or two data read lines may be provided for every bit line connected to respective sides of the bit line. Preferably one data write line is provided on either the right or left side of the bit line and all the line switches are turned on after the data is sensed. The read lines and write lines for both bit lines are preferably, connected on the same end of the bit lines.

Figure 5:
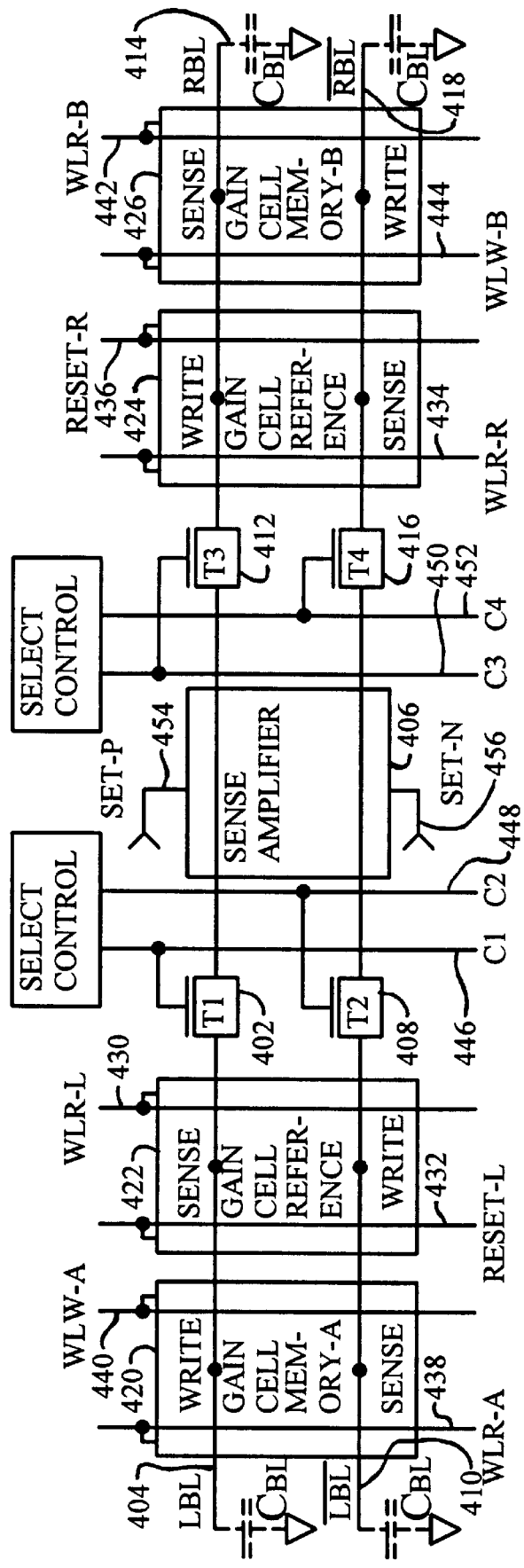
FIG. 5 is a schematic block diagram showing another embodiment of a portion of the memory array column of FIG. 2 using gain cells.

FIG. 5 shows another embodiment of a portion of a memory column 400 of the invention similar to the memory array of FIG. 2, but using gain cells. Switch T2 402 selectively connects/disconnects the left bit line 404 from the sense amplifier 406, and switch T2 408 selectively connects/disconnects complement left bit line 410 from sense amplifier 406. Switch T3 412 selectively connects/disconnects the right bit line 414 from the sense amplifier 406, and switch T4 416 selectively connects/disconnects complement right bit line 418 from sense amplifier 406.

A multitude of gain cells are attached between the bit lines, but only a few of which 420, 422, 424, and 426 are shown distributed on either side of the sense amplifier. Preferably about the same number of gain cells are connected to each half of each bit line. Preferably, gain cells 422 and 424 are connected to provide respective reference values to the bit line and bit line complement. That is, a reference value is read from reference gain cell 424 onto the bit line when a data value is read from memory gain cell 426 onto the complement bit line. Also, a reference value is read from reference gain cell 422 onto the complement bit line when data is read from memory gain cell 420 onto the bit line.

A word line 430 for reading from the left reference cell carries a (WLR-L) signal and a left reset line 432 carries a (RESET-L) signal to the left reference cell. A word line 434 for reading from the right reference cell carries a (WLR-R) signal to and a right reset line 436 carries a (RESET-R) signal to the right reference cell. A word line 438 for reading from memory gain cell A carries a (WLR-A) signal, and a word line 440 for writing to memory gain cell A carries a (WLW-A) signal. A word line 442 for reading from memory gain cell B carries a (WLR-B) signal and a word line 444 for writing to memory gain cell B carries a (WLW-B) signal.

Each switch 402, 408, 412, and 416 is connected to a control line 446, 448, 450, 452 respectively which carries an independent control signal C1, C2, C3 and C4 respectively to independently control the connection between each left or right bit line and the sense amplifier 406. Amplifier control lines 454, 456 carry activation signals SETP and SETN respectively to enable or disable the sense amplifier. The sense amplifier may be maintained in a disabled state except during a data read from the cells.

FIGS. 6a–6e are flow diagrams illustrating the process 500 of the invention for manufacturing a computer system. In FIGS. 6a–6d an integrated circuit chip is produced. In step 502, a semiconductor substrate is produced for manufacturing an integrated circuit. A highly pure, cylindrical semiconductor crystal may be produced, for example, by either the Czochralski or float-zone process. Preferably the semiconductor is silicon metal containing a relatively small concentration of another metal such as Boron to form N-type material. The cylinder may be sliced with a diamond saw to produced a wafer.

In the following steps 504–542 integrated circuitry is produced. Although described as separate steps, all the circuitry may be simultaneously produced in a batch process in which multiple wafers, each containing perhaps hundreds of integrated circuits, are simultaneously processed by a multitude of sequential photolithographic processes. First transistors are produced in the surface of the wafers. A mask is photolithographically formed (a photoresist layer is exposed to light through a mask and openings are developed in the photoresist) on the wafer surface; or formed separately and placed over the wafer surface. The wafer is placed in a heated vacuum chamber. A second metal such as Arsenic or Phosphorus is heated to evaporation and the metal vapor selectively introduced through openings in the mask to the surface to diffuse into the N-type material in sufficiently high concentrations to form regions of P-type material to provide contacts for a NMOSFET transistors and provide P-type wells. Another mask is provided and relatively larger concentrations of a metal such as Boron are diffused into regions within the P-type wells to form contacts for PMOSFET transistors.

A first dielectric layer such as $SiO_2$, is formed over the surface of the wafer, a mask is provided, and cavities are etched through the dielectric to the transistor contacts. Another mask is provided, and a first wiring layer 126 of conductive metal is formed over the dielectric. Preferably, first dielectric layer is $SiO_2$ formed by chemical vapor deposition (CVD) or grown in site by exposing the wafer surface to oxygen and/or steam, and the first wiring layer is N-type polysilicon (multi-crystal silicon) formed by evaporation or CVD. The first wiring layer includes the gates for the MOSFET transistors.

Further dielectric and wiring layers are formed by similar photolithographic processes to interconnect the semiconductor devices. The subsequent dielectric layers may be produced by spin coating with polyimide or another organic polymer, or CVD deposition of $SiO_2$, silicon nitride ($Si_3N_4$), glass, or an organic polymer. The subsequent layers of wiring may be formed by evaporating Al to form wires and fill the holes etched into the dielectric. The wafer is covered with a layer of dielectric passivation (e.g. glass or polyimide) to protect the integrated circuits from the external environment. Cavities are etched through the passivation to provide exposed contacts for interconnecting the integrated circuit. The wafer is diced into individual computer chips which are connected into a chip packages which is connected into a circuit board.

In step 504, data write, address, and control signal receiving circuits are produced in the substrate. In step 506, column decoder and row decoder circuits are provided in the substrate to convert memory address to column selection and word line signals respectively. In step 508, a control circuit is produced in the substrate to generate control signals.

In the following steps the production of a portion of a column of a memory array is described. The memory array may include a large number of such columns. In step 510, first and second bit lines are provided each with respective first and second portions (left and right sides). A similar pair of bit lines is produced for each column of the memory array. In step 512, first and second sense nodes of the respective bit line are provided. In step 514, first and second line switches are provided and connected between the first sense node and respective first and second portions (right and left sides) of first bit line. In step, 516 third and fourth line switches are provided and connected between the second sense node and the respective first and second portions of the second bit line. In step 518, bit line connection control lines are provided from the control circuit to the gates of line switches to control connecting /disconnecting the sense node from respective portions of the bit lines.

In step 520, two NMOS race transistors are provided and connected together to define a low potential node between the NMOS race transistors, with first NMOS race transistor extending to first sense node and second NMOS race transistor extending to second sense node; and with the gates of each respective NMOS race transistor connected to opposite respective second and first sense nodes. That is, for the transistor extending between the first sense node and the low potential node, the gate is connected to the second sense node, and for the transistor extending between the second sense node and the low potential node, the gate is connected to the first sense node. In step 522, two PMOS race transistors are provided and connected together to define high potential node between the two PMOS transistors. From the high potential node a first PMOS race transistor extends to the first sense node and second PMOS race transistor extends to the second sense node. Each PMOS race transistor extends to one sense node and the gate of the respective PMOS race transistor is connected to the opposite sense node in a manner similar to that described above for NMOS race switches. In step, 524 a high potential activation control line and a low potential activation control line are connected from the control circuit to respective high and low potential nodes. If an opposite signal (i.e. a low signal to the high potential node) is provided, the sense amplifier will be disabled (will not operate). The signal lines may include activation switches which prevent operation until a desirable time, but the switches are not simply on off switches, but can be controlled to provide a controlled gradient in potential.

In step 526, respective precharge switches may be provided and connected between a source of high potential and each respective bit line. Also, a precharge control line is connected from the control circuit to the gates of the precharge switches to allow precharging prior to a read cycle. In step 528, an equalization switch may be provided and connected between the first and second bit lines. Also, an equalization and a control line is provided from the control circuit to the gate of equalization switch. Generally, if precharge switches are provided which are connected to the same source of high potential, then an equalization switch is not required. An equalization switch may be sufficient for some types of cells such as some types of SRAM cells.

In step 530, respective data write lines are provided from the data write receiving circuit to the first and second bit lines. A data signal and complement data signal may be provided respectively to the bit line and complement bit line; or a data signal may be provided only to the bit line to which the memory cell for storing the data has access for writing the data to the memory cell. The two bit lines are not utilized for different bits of the same word since only one memory cell may be accessed at a time. In step 532, respective reset lines are provided from the control circuit to each reference memory cell. In step 534 a multitude of memory cells are connected to each side of each bit line including a first memory cell connected to the first side of the first bit line and a second memory cell connected to the second bit line. For efficiency the total number of memory cells connected to each bit line pair (bit line and complement bit line) is about equal to the total number of columns (bit line pairs) to form a so called square memory array. Also, the number of cells connected to each side of each bit line should be about equal. In step 536, respective access switches are provided and connected between each memory cell and a respective bit line side. One of the memory cells connected to each bit line is used to store a reference value for that bit line (or one for each side of the bit lines). In step 538, a respective reference control line is provided from the control circuit to the respective gate of the access switch of the reference memory cell for each respective bit line. The reference control line allows a reference value to be transferred between the respective reference memory cell and the respective bit line. In step 540, word lines are provided from the row decoder to the gates of the access switches to direct access signals in order to transfer data values between bit lines and the data memory cells (cells that are not reference memory cells). In step 542, respective data read lines are provided and connected to bit lines to direct data value from bit lines to the output driver.

In steps 544–550 other components of a computer system are provided and interconnected to manufacture a computer system. In step 544, a computer system bus is connected to the data write receiving circuit, addresses receiving circuit, and control receiving circuit for receiving respective data writes, addresses, and control signals from the bus and the bus is also connected to the output driver circuit to transmit read data onto the bus. In step 546, a clock is provided and connected to the bus to transmit clock signal through the bus to the control receiving circuit. In step 548, a CPU is connected to the bus to transmit addresses and control signals through the bus to the respective address receiving circuit and control signal receiving circuit. In step 550, a cache memory unit may be provided and connected to the bus. The cache memory unit transmits data writes to the bus and receives data reads from bus. In some computer systems data reads and writes may be made directly by the central processing unit and in some simple system no cache is provided.

In FIG. 7, data is written to a memory cell of the memory unit of the computer system. In step 562, all the line switches may be turned on in order to connect both sides of each line to the sense nodes. This allows a single write line to be used to write data to memory cells connected to either side of the bit line. Step 562 is not required if separate write lines are provided for each side of each bit line. In step 564, a data write is transmitted from cache memory, through the data write receiving circuit, through a data write line, to the first side of the first bit line. In step 566, an address is transmitted from the central processing unit, through the address receiving circuit, through the row decoder, through the first word line to turn on the respective access switch in order to connect the first memory cell to first side of first bit line. In step 568, the respective access switch is turned off to disconnect first memory cell from first side of first bit line in order to save the value in the first memory cell.

FIGS. 8a–8b show the process of the invention for reading from the memory array. The following steps 582–590 are performed prior to reading data from any memory cell. Depending on the type of memory cell, and the specific circuits used, these steps may be performed either after every read, or after every read and every write, or before the first read to a memory cell. In step 582 signals are transmitted from the control circuit through the line connection control lines to the gates of the line switches to turn on all the line switches to connect both sides of both bit lines to respective sense nodes. In step 584, a low signal may be transmitted through precharge signal line to the gates of the PMOS precharge switches to turn on the precharge switches to connect first and second bit lines to a source of high potential to precharge the first and second bit lines to a high potential. In step 586, a high signal may be transmitted from the control circuit through the precharge signal line to the gates of the precharge switches to turn off the precharge switches in order to disconnect the first and second bit lines from the source of high potential. In step 588, a low signal may be transmitted from the control circuit on the equalize control line to the gate of the PMOS equalization switch in order to connect first and second bit lines together to equalize the potential of first and second bit lines. In step 590, a high potential signal is transmitted on the equalize control line to disconnect the first and second bit lines. The equalization step is not required where both lines are precharge to the same potential.

The following steps 592–604 are performed in order to read data from a first memory cell. In step 592, a read signal is transmitted from the central processor unit through the control bus, through the control signal receiving circuit to the control circuit to set the control circuit into a read state. At the same time an address signal associated with the right side of the bit line is transmitted from the cache memory unit, through the data bus, through the address receiving circuitry, through the control circuit, and through the second line switch control line to the gate of the second line switch to turn off the second line switch to disconnect the second side of the first bit line from the first sense node.

Immediately after step 592, in step 594, the address is also transmitted from the address receiving circuit through the row decoder, through a word line to the gate of the first access switch to turn on the switch in order to connect the data stored in the first memory cell to the first side of first bit line. In step 596, which is preferably, performed simultaneously with step 594, the control circuit transmits a signal through the reference line to the gate of the access switch of the second memory cell to turn the switch on in order to connect the reference value stored in the second memory cell with both sides of second bit line.

Preferably, the first and second memory cells are essentially equal in size and output and each half of each bit lines presents the same load to the memory cells. Preferably the cells are designed so that the difference between the respective loads presented to the first memory cell (one half of a bit line) and the second memory cell (two halves of a bit line) result in a sufficient difference in potential between the respective sense nodes that the value in the first memory cell can be detected. Thus, a symmetric circuit can be used to produce different potentials depending only on how the switches are set.

In step 598, a high signal is transmitted by the control circuit through the high potential sense activation line to the high potential node; and low signal is transmitted from the control circuit through the low potential sense activation line to the to low potential node in order to activate the sense amplifier. The sense amplifier senses any difference between the potentials of the first and second sense nodes, amplifies the difference, and latches the difference in order to produce a high signal at one of the sense nodes and a low signal at the other sense node. Preferably, the potentials of the high and low potential sense activation lines are changed slowly, until the data value is sensed, and then changed more quickly to latch the value. In step 600, a data read is transmitted from the first sense node through the output driver circuit through the data bus to the cache memory unit. In step 602, the access switch of the first memory cell is turned off to disconnect first memory cell from first line to save the data value in the first memory cell. In step 604 a low signal is transmitted to the high potential node and a high signal is transmitted to the low potential node from the control circuit through the sense amplifier activation lines in order to deactivate the sense amplifier.

The inventions of Applicants' are especially useful for any type of electronic memory in which a stored value may be compared to a reference value. Some types of memory cells do not require such comparison, but the access speed may be significantly increase by using such a comparison.

FIG. 8c is a flow diagram of the process 610 of the invention for setting the reference value in the second memory cell. Anytime that a low value is read from a data cell onto a bit line, the potential in the bit line will be low and the potential in the complementary bit line will become high, and a low value read from the reference cell can not be immediately reset to a low value from the complementary bit line. For SRAM cells, and ROM cells the reference values are not lost when read and resetting the reference value is not required. Values read from some gain cells onto a complementary bit line are logically opposite from the value written from the bit line to the gain cell. Such reference gain cells can not be reset from the bit line if a low was read from the data gain cell. Such reference gain cells can be reset from the bit line during the precharging of the bit lines described above. For other types of cells a reset switch connected to a source of desired potential must be provided to reset the reference cell, and the following steps 612–614 are required.

In step 612, a high reset signal is transmitted from the control circuit through the reset control line to the gate of the reset switch of the second memory cell in order to turn on the reset switch to connect the second memory cell to a source of potential. For reference cells in which a low value is stored, the source may be a ground (e.g. 0 V), and for reference cells in which a high value is stored, the source may be a high voltage line (e.g. 3 V). In step 614, a low reset signal is transmitted from the control circuit through the reset control line to the gate of the reset switch for the second memory cell in order to turn off the reset switch and disconnect the second memory cell from the source of potential.

Figure 9:
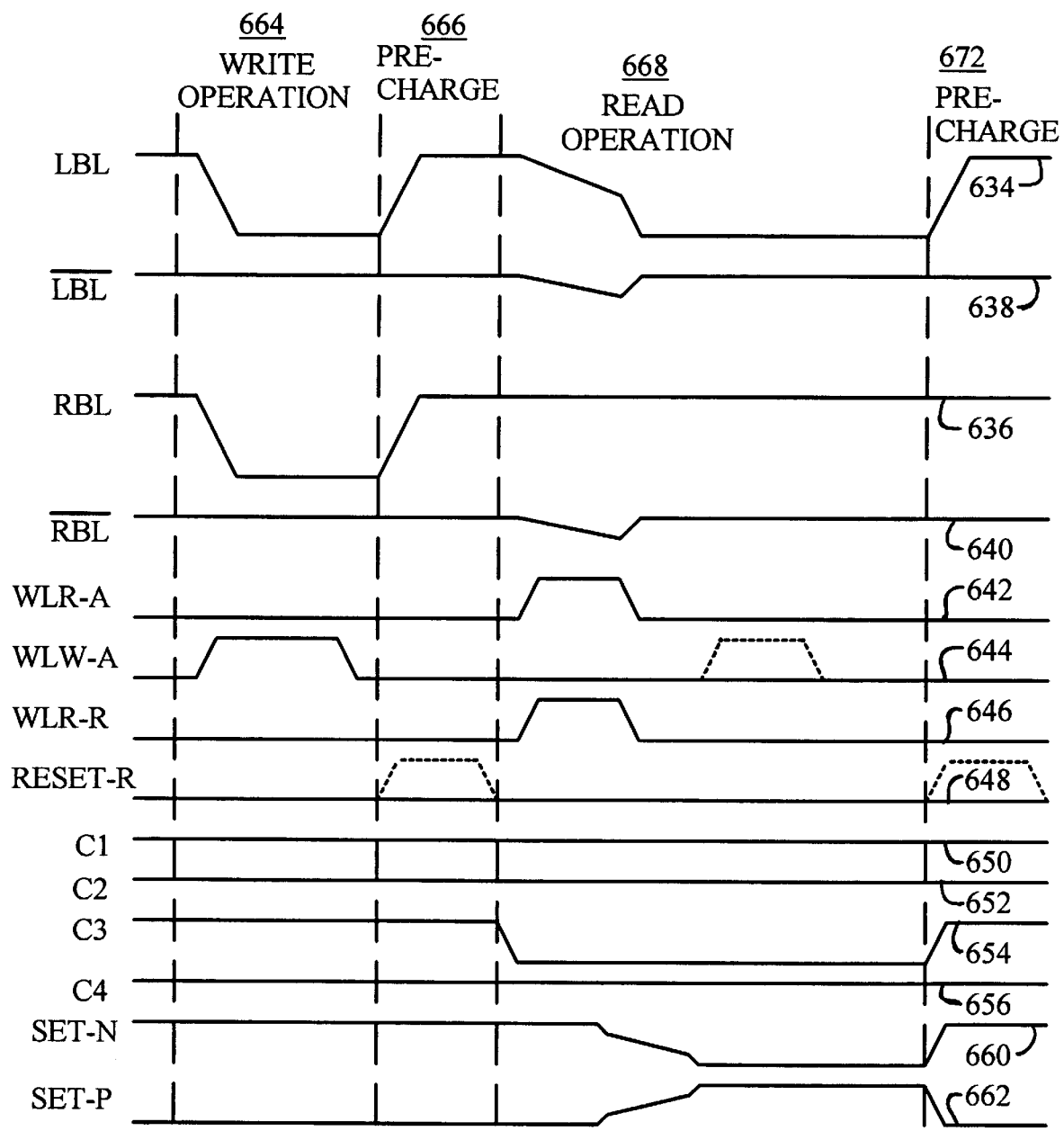
FIG. 9 is a timing diagram for the signals of FIG. 5.

FIG. 9 shows a timing diagram 630 of the portion of the column circuit of FIG. 5 of the invention including some signals of the signal lines of the circuits shown in FIG. 3. Normally the right and left bit line signals LBL 634 and RBL 636, and the left and right bit line complement signals LBL/ 638 and RBL/ 640 are precharged to a high state. The word line for reading from cell A WLR-A 642 and the word line for writing to cell A WLW-A 644 are normally in a low state to turn off the access switches to preserve the data and to preserve the high state of the bit line signals. The word line for reading the right reference cell WLR-R 646 and the reference line for writing to the right reference cell reset-R 648 are normally in a low state to turn off the access switches to preserve the reference value in the right reference gain cell. Signals C1 650, C2 652, C3 654, and C4 656 are normally set high to turn on switches 402, 408, 412 and 416 (labeled T1, T2, T3, and T4 in FIG. 5). Also, normally SETN 660 is set high and SETP 662 is set low to disable the sense amplifier.

Portion 664 of the timing diagram shows some of the signal levels in the memory circuit during a data write of a low value to data gain cell A (420 in FIG. 5). A unit of the computer system such as the central processing unit transmits a write control signal over the control bus; transmits data signals to be written to memory over the data bus; and transmits a memory address in which to write over the address bus. The data write receiving circuit (184 in FIG. 2) transmits the data signal through a data write line to the first bit line causing the LBL and RBL signals 634 and 636 respectively of the bit line to go low and the LBL/ and RBL/ signals 638 and 640 respectively to go high. Also, the address receiving circuit transmits the address through a decoder which converts the address to signals on data word lines. The write control signal is combined with the data word signal to set the WLW-A signal 644 high on the word line for writing to memory cell A. For DRAM and FRAM cells, the LBL signal (a low value) would be written from line 404, but for a gain cell the LBL/signal (a high value) is written from line 410. The WLW-A signal turns on a write access switch (not shown) to connect the left side of the complement bit line to data gain cell A for setting the gain cell to a high value. Then the address receiving circuit lowers the WLW-A signal 644 to save the value in the gain cell. Note that for gain cell A, the complement signal (e.g. high) on the complement bit line is stored and later the logically opposite value (e.g. low) is read onto the bit line. For about half of the gain cells (not shown) the bit line signal is stored and later the logically opposite value is read onto the complement bit line.

Portion 666 of the timing diagram shows some of the signal levels in the memory circuit during a precharge. In anticipation of the next read, after each write operation and after each read operation, the levels of signals LBL 634, RBL 636 of the bit line and signals /LBL 638, and /RBL 640 of the complement bit line are equalized. For some types of memory cells such as gain cells, the lines must be precharged to an equal potential which is opposite to the value read from the reference cell. In this example, a high value is stored in the reference gain cell and a low value is read from the cell as described below. The control circuit transmits a precharge signal (not shown) to the gates of precharge switches (238 and 240 in FIG. 3) which connect the bit lines to a source of high potential and the LBL 634 and RBL 636 signals of the first bit line increase to a high state, then the control circuit changes the precharge control signal to turn off the precharge switches.

The reference refresh (reset) part of the precharge operation is shown in dashed lines since it is not required for ROM or static memory cells, and it may occur during the read operation (not shown). A gain cell may be reset during the read cycle after the potential difference is sensed and amplified as described below. During precharging, a pulse of the RESET-R signal line turns on a write access switch to write the high precharge value in the gain cell for reading a low value from the cell. Alternately, the high value may be written from a reference potential either during precharging or in the read cycle after the value is latched. DRAM or FRAM cells are reset by connecting a capacitance storage element to a reference potential (e.g. ground for bit lines precharged to a high potential).

Portion 668 of the timing diagram shows some of the signal levels in the memory circuit during a data read of a low value from data gain cell A. A unit of the computer system such as a memory cache, transmits a read control signal and a memory address (to read data from) onto the bus. The address receiving circuit transmits the address to the control circuit which lowers signal C3 654 to disconnect the right side of the bit line from the respective sense node. The address receiving circuit transmits the address to decoders which convert the address to word line signals which are combined with the read control signal to raise the WLR-A signal 644 on the read data word line of data gain cell A. The high WLR-A signal opens a write access switch (not shown) to connect data gain cell A with the left side of the bit line. A low value is read from data gain cell A (since a high value was stored) and transmitted onto the bit line so that the LBL signal 634 decreases. At the same time the control circuit transmits a high WLR-R signal 646 onto the word line for reading the right reference gain cell to turn on the read access switch of the respective cell to connect the cell to the bit line complement. A low value is read from the reference gain cell (since a high value was stored) onto both the right and left halves of the complement bit line so as to reduce the value of both LBL/ and RBL/signals 638 and 640 respectively.

The value read from the reference gain cell (e.g. low) is logically opposite the value to which the bit lines are precharged (e.g. high). For bit lines precharged to a high value, a low value is read from a gain cell onto the bit line by transferring a low current from the bit line through the gain cell to ground, and a high value is read to the bit line by presenting a high impedance to the line in order to maintain the precharge. Values are read from DRAM and FRAM cells by connecting a plate of a capacitor, charged to the stored potential, to the bit line. If the stored potential is the same as a precharge potential then the precharge is maintained, and if the stored potential is logically opposite the precharge potential, then current flows to equalize the potentials of the bit line and capacitor plate. When the value read from both the reference and data cells is the same and is opposite (the complement of) the precharge value, then because the reference cell is loaded by both sides of the bit line, but the data cell is only loaded by one side of the bit line complement, the potential of the bit line will decrease more rapidly than the potential of the complement bit line.

The sense amplifier is activated as soon as the difference between the bit line potential and the complement bit line potential is large enough to be sensed reliably (i.e. with respect to noise). The sense amplifier is activated by SETN signal 660 going low and SETP signal 662 going high. Then the difference in potentials will be amplified, resulting in a low potential for the LBL signal 634 in the left bit line and a high potential signal for the LBL/ and RBL/signals 638 and 640, respectively, in the complement bit line. The low signal from the sense node may be transmitted from the bit line to the output driver circuit to transmit the data onto the data bus. The data refresh part of the read operation is shown in dashed lines since it is not required for ROM or static memory cells. In order to refresh the data value stored in memory gain cell A, after the potential difference is sensed, amplified and latched, as the data is sent to the output driver circuit, the WLW-A line is pulsed high to turn on the write access switch between gain cell A and the left side of the bit line to store a low value back into cell A. Then the WLW-A signal is lowered to turn off the switch to save the low value in memory cell A.

Resetting the reference value during the read operation is not shown in the timing diagram since it is preferably done during precharging after each data read and write, as shown in dashed lines and described above. The reference cell may be reset during the read cycle after the potential difference is sensed and amplified, as the data is sent to the output driver circuit. To reset the reference cell, a pulse of the RESET-R signal line turns on a write access switch connected between the capacitive element of the cell and a reference potential. For lines precharged to a high value, a high reference value may be used for gain cells and a low reference value may be used for DRAM and FRAM cells.

Portion 672 of the diagram shows another precharge cycle in which the bit lines are precharged as described for portion 666 above in anticipation of another read operation.

Figure 10:
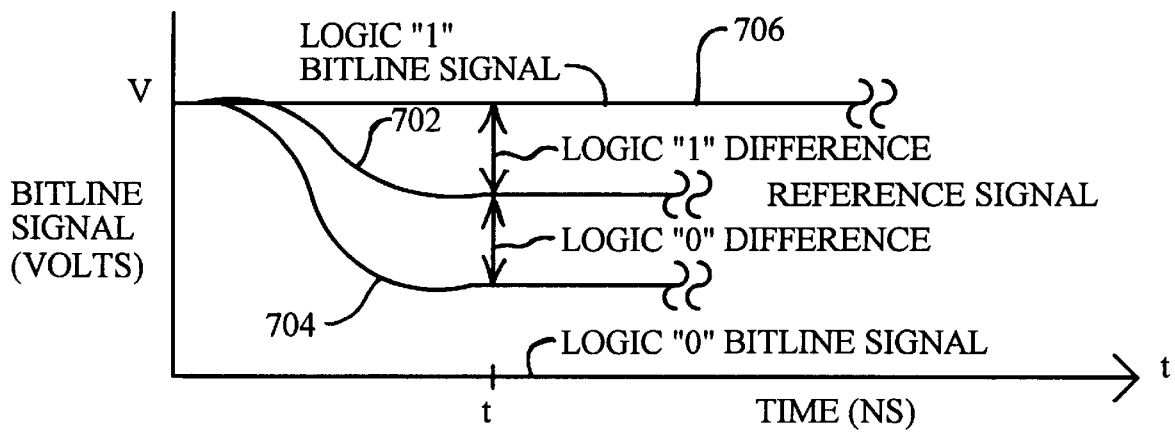
FIG. 10 is a chart illustrating the change in potential in relation to time for bit lines connected to dynamic memory cells such as those in FIGS. 13–15 for data and reference.
Figure 11:
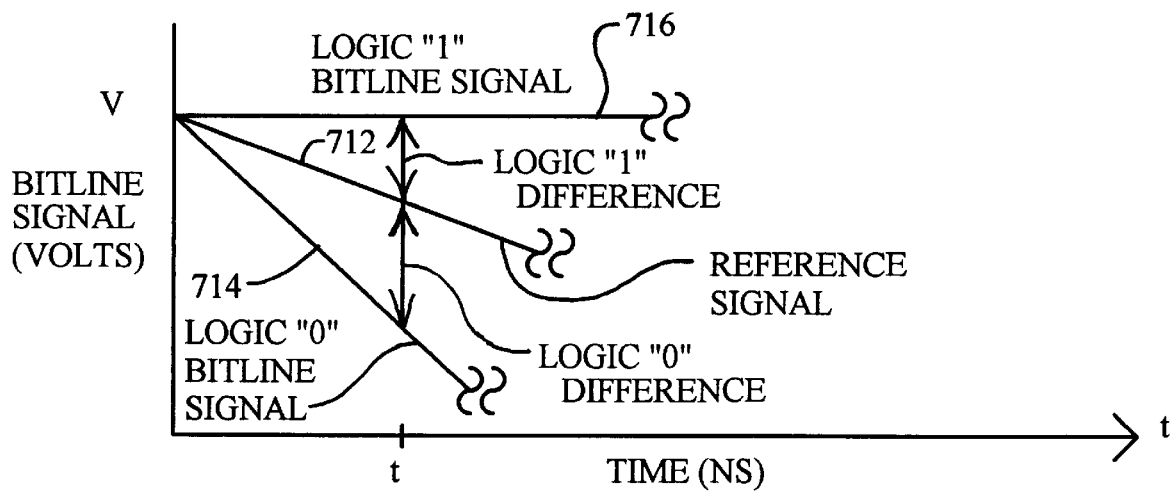
FIG. 11 is a chart showing the change in potential in relation to time for bit lines connected to gain cells or static memory cells such as those of FIGS. 16–19 for data and reference.

FIGS. 10 and 11 are plots of potential signals verses time for a bit line half connected to the data cell, and for the pair of bit line halves connected to the reference memory cell. The plots are for a system in which the bit lines are precharged to a high potential and a logic "0" is read from the reference memory cell. The plots of the potential signals for the one bit line half connected to the data memory cell include a plot when a logic "0" is read, and a plot when a logic "1" is read from the data memory cell. The plots allow the data potential signal and reference potential signal to be compared.

FIG. 10 is a plot 700 of potential signals in the bit lines versus time for DRAM and FRAM type capacitance memory cells. The reference potential signal 702 when a "0" is read from a reference cell onto a pair of bit line halves, is between the data potential signal 704 when a data value of "0", and the data potential signal 706 when a data value of "0" is read from a data cell onto a single half bit line. Potential signal 706, when a data value of "1" is read from a data cell onto a single bit line half, is shown as a constant high level. Since the bit lines are precharged to a high potential, turning on the access switch to read a "1" from the memory cell has little effect on the potential signal in the single bit line half. The cross capacitance between the single data bit line half and the pair of reference bit line halves, when the reference bit line half is discharged, may result in a small decrease in potential in the data bit line half. This change is not shown.

The potential signal 704 of the single data bit line half when a logic "0" is read from the memory cell, depends on the ratio between the capacitance of the single bit line half and the combined capacitance of the DRAM memory cell with the single bit line half. When the access switch of the DRAM memory cell is turned on, and a low value is read, the precharge in the single data bit line half is partially redistributed from the bit line half into the capacitance of the DRAM cell. The potential signal 702 in the reference bit line half depends on the ratio between the capacitance of the pair of reference bit line halves and the combined capacitance of the DRAM memory cell with the pair of bit line halves. Preferably, the capacitance of the memory cells is selected to maximize the potential difference between the reference potential signal and the data potential signal when the same value was stored in both memory cells. For dense memory, the capacitance of each memory cell may be from 0.1 to 0.2 times the effective capacitance of a single half of a bit line. For embedded memory, the capacitance of each memory cell may be from 0.1 to 1.0 times the capacitance of half a bit line. The plot is for a system in which the capacitance of each memory cell is about 1.0 times the capacitance of a bit line half. For smaller factors the settling time to reach a difference and the final differences will be proportionately smaller.

FIG. 11 is a plot 710 of potential signals in the bit lines versus time for static memory cells and gain type capacitance memory cells when the bit lines are precharged to a high potential. The reference potential signal 712 when a "0" (low value) is read from a reference cell onto a pair of bit line halves is between the potential signal 714 when a data value of "0", and the potential signal 716 when a data value of "1" (high value) is read from the data cell onto a single bit line half. Potential signal 716 when a logic 11111 is read from the data memory cell is shown as a constant high level.

When a "0" is read, current flows from the bit line into the memory cell until the potential in the bit line reaches a low potential. For a gain cell when a "1" is read, then the gain cell presents a high impedance to the bit line in order to maintain the high precharge potential in the bit line. For a static memory cell, when a "1" is read, the static memory cell presents a high potential to the bit line to maintain the high precharge potential in the bit line. The bit lines are precharged to a high value, thus, turning on the access switch when a "1" is read from the memory cell has little effect on the potential signal in the bit line half. When the bit lines are precharged to a high value, and the low value is read from the reference cell onto the bit line pair, the cross capacitance between the data bit line half and the reference bit line pair of halves, when the reference bit line half is discharged, may result in a small initial decrease in potential in the data bit line half. This small drop in potential is not shown. The current between the gain cell and the bit lines is substantially independent of the potential in the bit lines, until the potentials are equalized, so that the potential decreases linearly with time (as shown), and the speed of decrease is proportional to the effective capacitance of the bit lines connected to the gain cell.

The potential signal 714 of the single data bit line half when a logic "0" is read from the memory cell, depends on the capacitance of the single bit line half and the current of the memory cell. When the access switch of the gain cell is turned on, the precharge in the single data bit line half starts to flow into the gain cell until the line is discharged. The potential signal 712 in the pair of reference bit line halves depends on the capacitance of the pair of reference bit line halves and the current of the memory cell. When the same potential value is stored in the data gain cell and reference gain cell, (e.g. a low potential) the bit lines are precharged to the opposite potential value (e.g. a high potential), then the difference in potential between the pair of reference bit line halves and the single data bit line half will increase until the data signal 714 reaches the potential level for the value being read, and then the difference in potential will decrease until the reference signal reaches the potential of the value being read. Preferably, the sense amplifier is activated as soon as the potential difference is sufficient to be detected with respect to noise.

Figure 12:
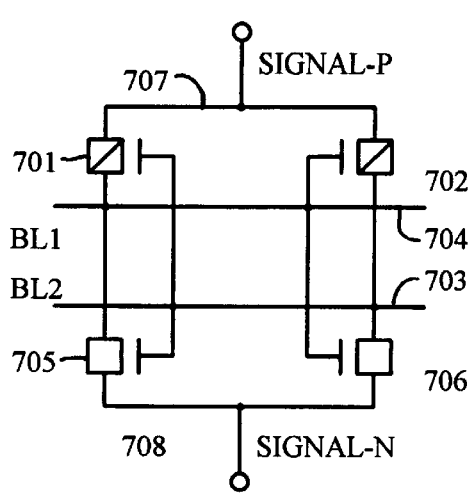
FIG. 12 is a schematic block diagram of the sense amplifier of FIGS. 3 and 5.

FIG. 12 is a simplified view of the preferred sense element 700 of the invention which includes two PMOS transistors 701 and 702 in a race amplifier arrangement between two sense nodes 703 and 704, and two NMOS transistors 705 and 706 in a similar race amplifier arrangement. When SIGNAL-P at high activation net 707 is slowly raised and SIGNAL-N at low activation net 708 is slowly lowered, the amplifier discharges one of the sense nodes (the one having a lower potential) down to a fully low potential (e.g. 0 V) and charges the other sense node (the one with the higher potential) to a fully high potential value (e.g. 3 V). This amplification is latched as long as SIGNAL-P is high and SIGNAL-N is low . Node 703 is connected to low activation net 708 through NMOS switch 706 whose gate is connected to node 704. Node 704 is connected to low activation net 708 through NMOS switch 705 whose gate is connected to node 703. As SIGNAL-N is slowly lowered whichever node has the highest potential turns on the switch that connects the other node to the low activation net to allow the other node (with the lowest potential) to be discharged faster to further reduce the potential of the other node. Thus the difference between the potentials of the nodes is amplified and latched. In a similar cross race manner the nodes are cross connected through PMOS switches to a high activation source to raise the potential of whichever node has the highest potential.

Figure 13:
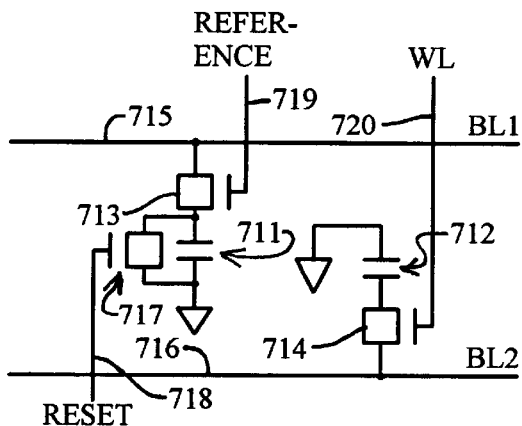
FIGS. 13–15 are embodiments of the dynamic memory cells of FIG. 3 which need refreshing after every read.

FIG. 13 shows a portion of another memory column 710 with a pair of DRAM cells (memory elements). Each cell includes a capacitor 711, 712 connected to ground and to an access switch 713, 714 (MOS transistor) respectively, and each access switch connects the respective capacitor to a bit line 715, 716 with signals BL1 and BL2 respectively. One of the cells is a reference cell and the other is a data cell. Signal REFERENCE in reference line 719 is pulsed for reading the reference value onto bit line 715. Signal WL in line 720 is pulsed for reading and for writing data values between bit line 716 and capacitor 712.

Figure 14:
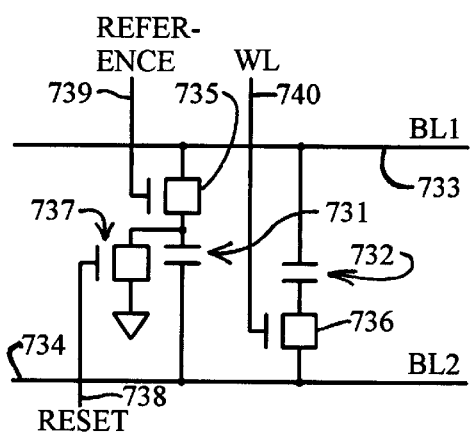

FIG. 14 shows a portion of another memory column 720 with another pair of DRAM cells. Each cell is connected to a bit line 733 and 734 with signal BL1 and BL2. In this case the bit line 734 is a complement bit line and signal BL2 is a complement signal. That is, the complement bit line signal always has a potential logically opposite to the potential of the bit line signal. Each cell includes a capacitor 731, 732 with a first plate connected to a bit line 734, 733 respectively, and a second plate connected to the opposite bit line 733, 734 respectively through access switch 735, 736 respectively.

The reference cell includes reset switch 737 which connects the second plate of capacitor 731 to a source of low potential (ground) when signal RESET is pulsed in reset line 738, to store a low value in the reference cell. When signal REFERENCE on reference line 739 is made high, switch 735 is turned on, and the charge in capacitor 731 is redistributed between the capacitor and the bit lines.

For the data cell, when signal WL in word line 740 is made high, switch 736 is turned on, and the charge in capacitor 732 is redistributed between the capacitor and the bit lines. When signal WL in word line 720 is made low, a charge proportional to the difference in the potentials between the bit lines is stored in capacitor 732.

Figure 15:
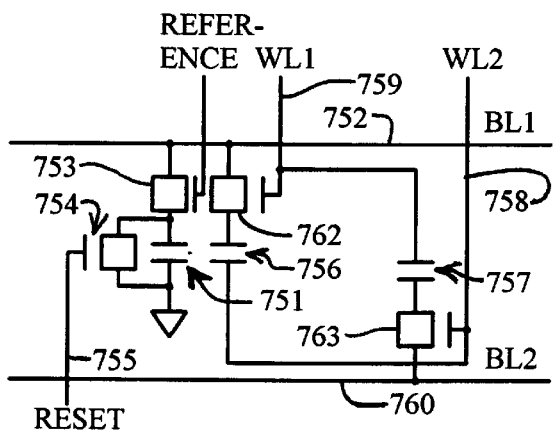

FIG. 15 shows a portion of another memory column 750 with three DRAM cells (memory elements). One of the DRAM cells is a reference memory cell with a capacitor 751 with a first plate connected to ground and a second plate connected to bit line 752 through write access switch 753. A reset switch 754 is connected between the second plate and ground with the gate of the reset switch connected to reset line 755. When a RESET signal is pulsed in line 755 the reference is reset to a low value.

The other two DRAM cells are data memory cells, and each includes a capacitor 756, 757 with a first plate connected to a word line 758, 759 respectively and a second plate connected to a bit line 752, 760 respectively through a respective access switch 753, 763. Each of the signals WL1 and WL2 is low whenever the other of the signals is high. For example, when WL1 is high to connect between capacitor 756 and bit line 752 to write BL1 to capacitor 756 or read capacitor 756 onto BL1, then WL2 is always at a low potential. Signals WL1 and WL2 are kept at a low potential except that, one at a time, they are activated to read the value stored in the capacitor onto a respective bit line or to write the value from the bit lines onto a respective capacitor. When switch 762 or 763 is turned on, the charge stored in the respective capacitor is distributed between the capacitor and the respective bit line; and when the switch is closed a charge proportional to the potential in the respective bit line is stored in the capacitor.

Figure 16:
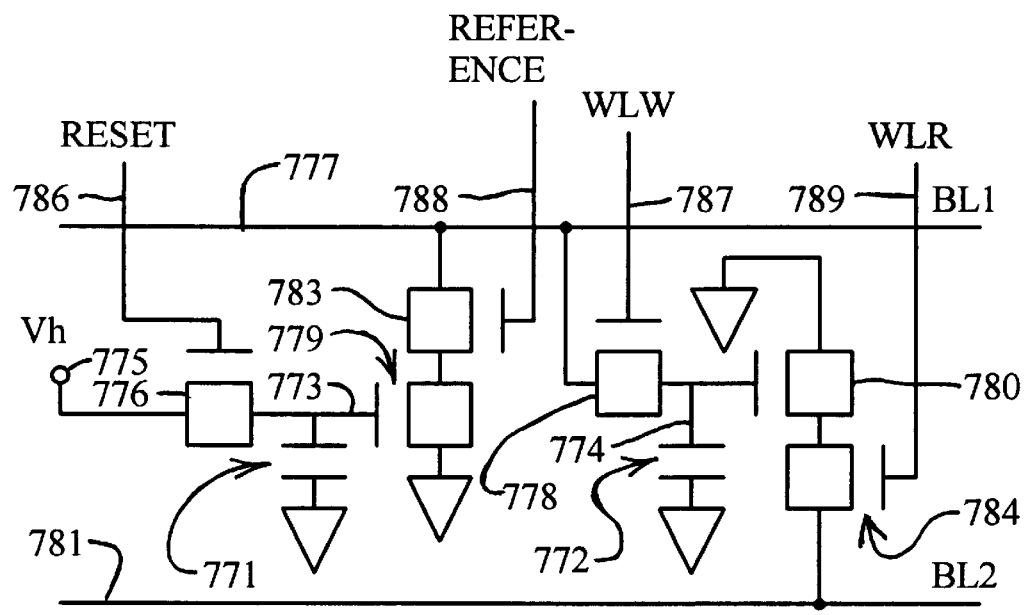
FIGS. 16–17 are embodiments of gain cells which need occasional refreshing.

FIG. 16 shows a portion of another memory column 770 with two gain cells (memory elements). Each memory gain cells includes a capacitor 771, 772 with a first plate connected to ground and a second plate connected to the gate of a storage switch 779, 780. Each bit lines 777, 781 is connected to ground through respective storage switch 779, 780 and through respective access switch 783, 784 whose gates are connected respectively to reference line 788 and read word line 789 and controlled by REFERENCE signal and WLR signal for reading a low value onto the respective bit line.

One of the gain cells is a reference memory cell with a second plate of capacitor 771 also connected to a source of high potential (Vh) 775 through reset switch 776. The gate of the reset switch is connected to reset line 786 with RESET signal which pulses to reset the charge in capacitor 771 to a high value. The other gain cell is a data memory cell with a second plate of capacitor 772 also connected to bit line 777 through write access switch 778 whose gate is connected to write word line 778 with signal WLW which is pulsed to write the data value from bit line 777 to capacitor 772.

For example, when there is a high potential on bit line 777 and WLW goes high then a charge is stored in capacitor 772 that is proportional to the potential of bit line 777 (the data value) and then WLW goes low to save the high value in memory and switch 780 is kept open by the charge. Then when WLR is set high to read the memory, switch 753 is turned on and current flows from the complementary bit line 781 through switch 780 and switch 784 to ground (a source of low potential) until BL2 reaches low potential. Thus, when a high value is stored from bit line 777, a logically opposite low value will be read onto complement bit line 781.

Figure 17:
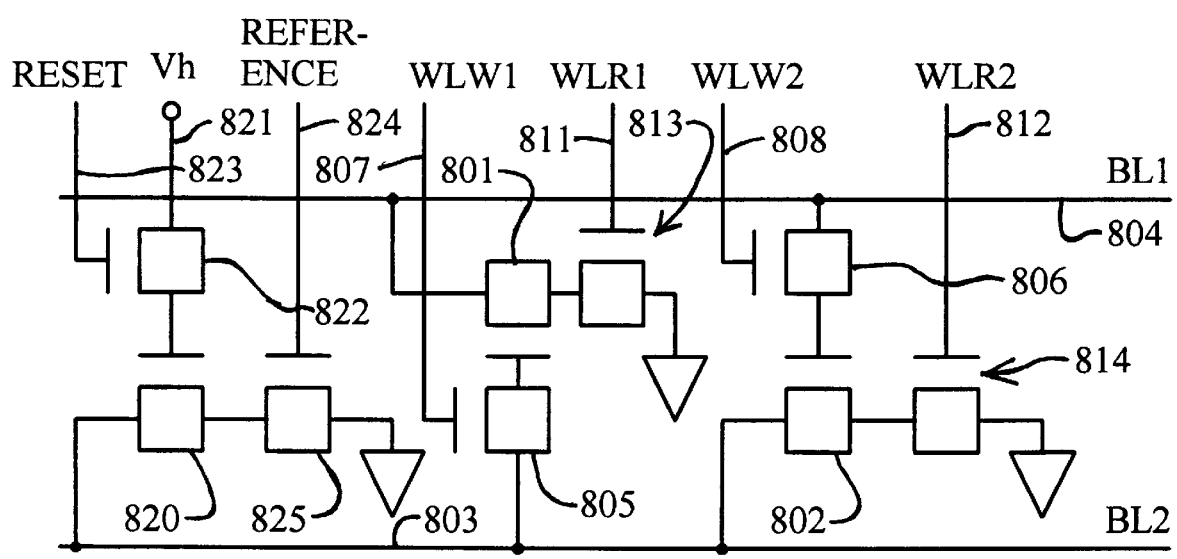

FIG. 17 is similar to FIG. 16 and shows a portion of another memory column 800 with three gain cells. Two of the gain cells are data storage elements and each includes a storage switch 801, 802 connected to bit line 804 and 803 respectively and having a gate in which a high or low potential value is stored. The gates of the storage switches are each connected to bit line 803, 804 through a write access switch 805, 806 controlled by signals WLW1 and WLW2 on word lines 807 and 808 for writing a value from the bit line to the gate of the storage switch. The charge stored in the gates of storage switches 805 and 806 control whether such storage switches are turned on or off. The data is accessed by signals WLR1 and WLR2 on word lines 811 and 812 which control switches 813 and 814 that connect between storage switches 801 and 802 and a source of low potential (ground). For example, when there is a high potential on bit line 803 and WLW1 goes high then a charge is stored in the gate of storage switch 801 and then WLW1 goes low to save the high value in memory, switch 801 is kept open by the charge on the gate. Then when WLR1 is set high to read the memory, switch 813 is turned on and current flows from bit line 804 through switch 813 and through switch 801 to the source of low potential until BL1 reaches the low potential. Thus, a high value stored from bit line 803 is read as a low value onto complement bit line 804.

One of the gain cells is a reference storage element and includes a storage switch 820 connected to bit line 803 and having a gate in which a high potential value is stored. The gate of the storage switch is connected to a source of high potential through a reset switch 822 controlled RESET signal on reset line 823 for resetting the reference storage to a high value. The high charge stored in the gate of switch 820 keeps the switch turned on. The reference value is accessed by signal REFERENCE on reference line 824 which control switches 825 that connects between switches 820 and a source of low potential (ground). When the REFERENCE signal is pulsed, then current flows from bit line 803 through switches 820 and 825 to ground, to read a low value onto bit line 803.

Figure 18:
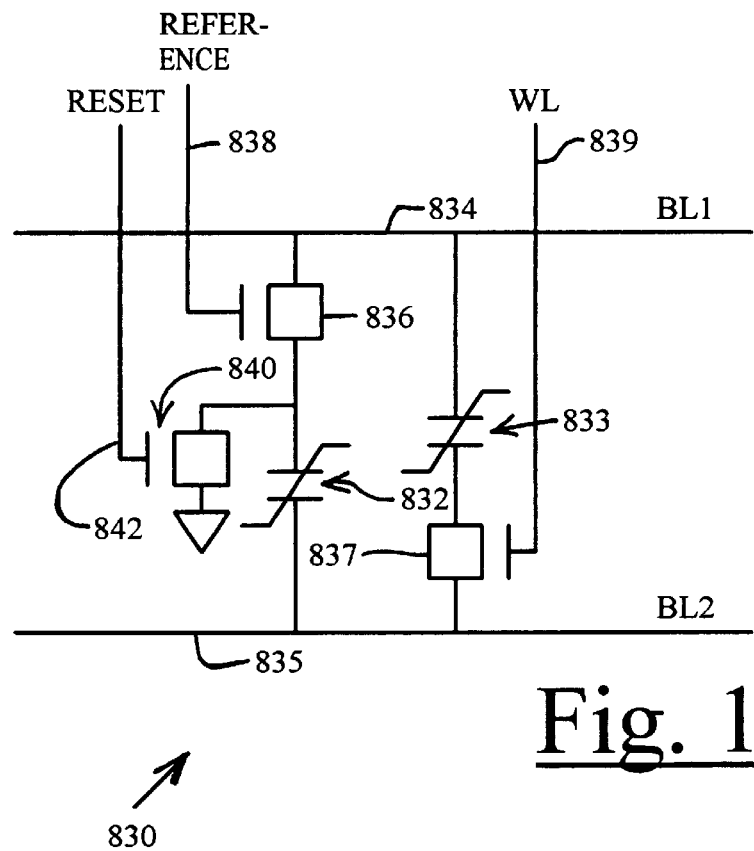
FIGS. 18–19 are embodiments of static memory cell that do not need refreshing.

FIG. 18 is similar to the DRAM cell of FIG. 14 and shows a portion of a memory column 830 with a pair of ferromagnetic random access memory (FRAM) cells. These FRAM memory cells can be operated in a non-volatile mode without reset, but may be operated like DRAM cells by refreshing the data and resetting the reference cells. Ferromagnetic capacitors 832, 833 have a first plate connected directly to bit lines 835, 834 respectively; and a second plate connected indirectly to bit lines 834, 835 respectively through access switches 836, 837 respectively. The gates of the access switches 836, 837 are respectively connected to reference line 838 and word line 839 with respective signals REFERENCE and WL which are pulsed to read the stored value onto respective bit lines. The quantity of charge stored by a ferromagnetic capacitor due to an applied potential depends on the direction of the applied potential and on the magnetic state of the capacitor. The magnetic state of the capacitor can be changed by imposing a sufficiently high potential across the capacitor in the desired direction. The FRAM storage cells may be operated similar to DRAM cells, but if not recently refreshed, the potential difference between the bit lines is less for an unrefreshed FRAM cell than for a refreshed DRAM cell. In order to reset the capacitor 832 of the reference cell to a low value, the second plate of the capacitor is connected to ground through reset switch 840. The gate of the reset switch is connected to reset line 842 with RESET signal which is pulsed to connect the second plate to the ground to reset the storage cell.

Figure 19:
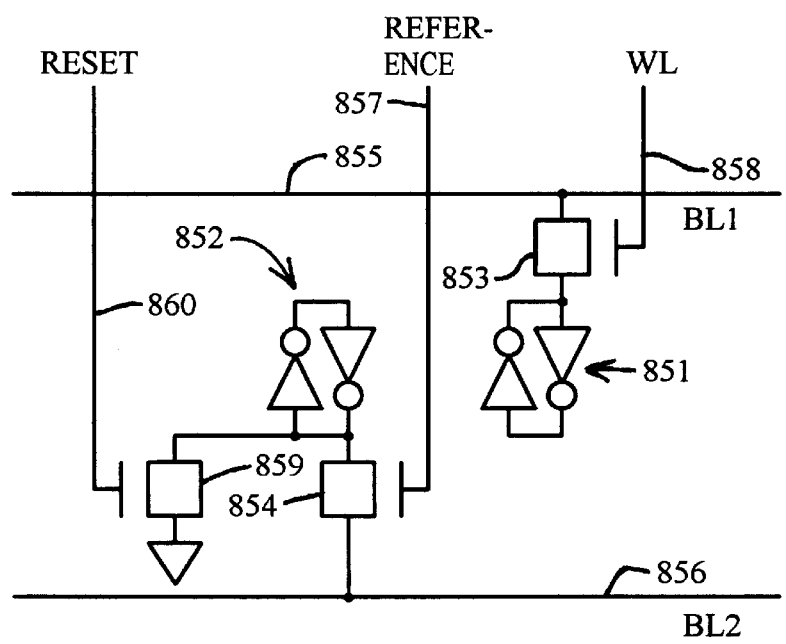

FIG. 19 shows a portion of another memory column 850 with a pair of SRAM memory cells each including a pair of inverters 851, 852 in a loop in which a value is stored, and access switches 853, 854 respectively connecting between a first node of the inverter loops and bit lines 855, 856 respectively. The gates of the access switches 853, 854 are connected respectively to reference line 857 and word line 858 with respective signals REFERENCE, WL which are pulsed for reading a value from the respective inverter loops onto the respective bit lines. When a value on the bit line (e.g. high) is opposite from the value stored in the inverter loop (e.g. low), and the WL signal rises quickly to a high value to write the bit line value to the loop, then the current entering the inverter loop through the access switch overpowers the current provided by the respective inverter and the value is written from the bit line to the inverter loop. However, when the bit line is precharged to value (e.g. high) that is opposite to the value stored in the inverter loop (e.g. low) and isolated, and the WL signal rises slowly or rises only to an intermediate value, then the current flow into the inverter loop through the access switch is not sufficient to overpower the respective inverter and the value stored in the inverter loop is read onto the bit line. The inverters of inverter pairs 851 and 852 are preferably, CMOS inverters.

A reference value may be written from the bit lines to the reference cells during system startup. More preferably, the reference cell includes a reset switch 859 connecting the first node of the respective inverter loop and ground. The gate of the reset switch may be connected to reset line 860 with a RESET signal that may be pulsed to initially reset the reference cell to a low value. The reference cell does not need to be reset except during system startup.

The invention has been described with reference to specific embodiments including the best mode for carrying out the invention, and with sufficient detail that anyone skilled in the art can utilize the invention. Those skilled in the art may modify these embodiments within the spirit of the invention, and thus, the description does not limit the present invention to the disclosed embodiments. The invention is limited only by the following appended claims.

We claim:

1. An integrated circuit, comprising:
    a first line with a first and second half each having substantial effective capacitance;
    a first node of the first line;
    first and second line switches connecting between the first node and the respective first and second half of the first line;
    a second line with a first and second half each having substantial effective capacitance;
    a second node of the second line;
    third and fourth line switches connecting between the second node and the respective first and second half of the second line;
    at least one first and one second storage elements;
    a first and second access switch effectively connecting/disconnecting the first and second storage elements respectively to the respective first half of the first and second lines respectively;
    line switch control means to set the first line switch on, the second line switch off, the third line switch on and the fourth line switch on at a selected time; and to set the first line switch on and the second line switch on at another time.

2. The integrated circuit of claim 1, in which:
    the line switch control means includes means to individually control the selection of each line switch;

the integrated circuit further comprises, a precharging circuit for precharging the second line and at least the first half of the first line to predetermined potentials prior to the selected time; and a precharge control circuit to control the precharging of the lines;

the integrated circuit further comprises, an equalizing circuit for equalizing the potentials of the two lines prior to the selected time; and an equalization control circuit to control the equalization of the line potentials;

the integrated circuit further comprises comparing means communicating with the first portion or second node of the first line and with the second line for comparing the potentials of the two lines at the selected time and for providing a data signal with a potential that depends on the comparison;

the comparing means are connected to the first and second nodes and compare the potential of the nodes at the selected time;

the comparing means amplify the difference between the first and second nodes to different potential levels;

the comparing means include a sense amplifier latch with cross-coupled transistors in a race mode between the first and second node;

the sense amplifier latch is a CMOS device and includes a pair of NMOS transistors and a pair of PMOS transistors;

the sense amplifier latch includes:
  a first NMOS transistor connected between the first node and a first activation net for low potential and a second NMOS transistor connected between the second node and the first activation net with the gate of the first NMOS transistor connected to the second node and the gate of the second NMOS transistor connected to the first node; and
  a first PMOS transistor connected between the first node and a second activation net for high potential and a second PMOS transistor connected between the second node and the second activation net with the gate of the first PMOS transistor connected to the second node and the gate of the second PMOS transistor connected to the first node;

the integrated circuit further includes activation control means to control the potential of the first activation net and to control the potential of the second activation net for turning on the sense amplifier latch at the selected time;

the integrated circuit further comprises a respective multitude of additional storage elements connected to each half line through additional respective access switches between the respective storage element and the respective half line;

the storage elements connected through respective activation switches to one of the lines, are gain cells;

the integrated circuit further comprises means for writing a value to the first and second memory elements after a read period, approximately equal to the original values in the first and second memory elements before the read period;

the integrated circuit further comprises:
  address receiving circuit for receiving an address from a processing unit through an address bus;
  write data receiving circuit for receiving data for writing into the first storage unit through a data line;
  control receiving circuit connected to a control bus for receiving control signals including read and write signals from a processor and clock signals from a system clock;
  column and row decoders connected to the circuit for receiving an address for converting address signals to word line signals and read/write data line selection signals;
  a row multiplexer to select a read/write data line for receiving and transmitting data; and
  an output driver circuit connected to the selected read/write data line for generating and transmitting a data signal onto a data line.

3. The integrated circuit of claim 1, in which:
the storage elements connected through a respective memory switch to one of the lines are DRAM cells and each includes a capacitor connected between one end of the respective access switch to the other line.

4. The integrated circuit of claim 1, in which:
the storage elements connected through respective memory switches to one of the bit lines are DRAM cells, and each includes a capacitor connected between one end of the memory switch and a source of low or high potential.

5. The integrated circuit of claim 1, in which:
the storage elements connected through respective memory switches to one of the bit lines are ROM cells, and each includes a floating gate capacitor connected between one end of the switch to a source of low or high potential.

6. A computer system, comprising:
a differential potential sensor for comparing the potential at a first node with the potential at a second node and generating a data signal depending on the comparison;
a first portion of a first bit line and a first line switch, connected between the first portion of the first bit line and the first node of the voltage sensor;
a second portion of a first bit line and a second line switch, connected between the first portion of the first bit line and the first node of the voltage sensor;
a first portion of a second bit line and a third line switch, connected between the second portion of the first bit line and the second node of the voltage sensor;
a second portion of a second bit line and a fourth line switch, connected between the second portion of the first bit line and the second node of the voltage sensor;
a first storage element and a first access switch connected between the first storage element and the first portion of the first bit line;
a second storage element and a second access switch connected between the second storage element and the first portion of the second bit line;
control means including a central processing unit for transmitting addresses and receiving data and a decoder for decoding the addresses to provide word signals to turn the first and second access switches on during read periods, the control means including switch selection means to provide signals for maintaining the first, third, and fourth line switches on and the second line switch off simultaneously during read periods to reduce the potential of the second bit line with respect to the first bit line;
a data line communicating with the first portion of the first bit line or the first node of the comparator to transmit the read signal; and
a bus connecting the central processing unit with the decoder to transmit address signals and for receiving the data signals from the read line.

7. A process for operating an integrated memory unit, comprising:
   writing a data value to a first storage element connected with a first half of a first bit line through a first memory-access switch;
   turning off the first memory-access switch; writing a reference value to a second storage element connected with a first half of a second bit line through a second memory-access switch;
   turning off the second memory-access switch;
   turning on a line switch, connecting between a first node of a differential potential sensor and the first half of the first bit line;
   turning on line switches, connecting between a second node of the differential potential sensor and respective first and second halves of the second bit line;
   turning off a line switch, connecting between the first node of the differential voltage sensor and a second half of the first bit line;
   equalizing the potential of the first half of the first bit line and both halves of the second bit line;
   turning on the first and second memory access switches;
   comparing the potential of the first node with the potential of the second node of the differential potential sensor; and
   generating and transmitting a read signal depending on the comparison.

8. The process of claim 7, in which:
   the process further comprises, precharging the first half of the first bit line and both halves of the second bit line to a predetermined equal high potential;
   the process further comprises rewriting the same data value to the first storage element; and
   the process further comprises rewriting the reference value to the second memory element.

9. An integrated circuit, comprising:
   a first line with substantial effective capacitance, including a first and second half;
   a first node;
   first and second line switches connecting between the first node and the respective first and second half of the first line;
   a second line with substantial effective capacitance, including a first and second half;
   a second node;
   third and fourth line switches connecting between the second node and the respective first and second half of the second line;
   at least one first and one second storage elements with essentially equal dimensions;
   first and second access switches effectively connecting/disconnecting the first and second storage elements respectively to the respective first half of the first and second lines respectively;
   a precharge circuit to precharge at least the respective first half of the first and both halves of the second lines to approximately equal high potentials; and
   comparing means communicating with at least the respective first half of the first and second lines for comparing the potentials of the two lines when the access switches are turned on and for providing a data signal with a potential that depends on the comparison.

10. An integrated circuit comprising:
    a memory cell;
    a reference cell;
    a sensing system for said memory cell;
    an arrangement for generating a one-half swing voltage reference for said memory cell sensing system;
    said generating arrangement including at least one control bit line coupled to said memory cell and said reference cell, and a plurality of multiplex devices for selectively coupling said memory cell sensing system to each control bit line, each control bit line having a reference capacitance;
    wherein said one-half swing voltage reference is generated using twice said control bit line reference capacitance, and wherein said reference cell transfers a reference current or charge onto twice said reference capacitance that is substantially equivalent to a current or charge transferred by said memory cell onto each control bit line.

11. The integrated circuit of claim 10, wherein said plurality of multiplex devices can couple said memory cell sensing system to any combination of said control bit lines.

12. An integrated circuit comprising:
    a memory cell;
    a reference cell;
    a sensing system for said memory cell;
    an arrangement for generating a one-half swing voltage reference for said memory cell sensing system;
    said generating arrangement including n control bit lines coupled to said memory cell and said reference cell, and a plurality of multiplex devices for selectively coupling said memory cell sensing system to each of said n control bit lines, each of said n control bit lines having a reference capacitance;
    wherein said one-half swing voltage reference is generated using n times said control bit line reference capacitance, and wherein said reference cell transfers a reference current or charge onto n times said reference capacitance that is substantially equivalent to n/2 times a current or charge transferred by said memory cell onto each control bit line.

13. The integrated circuit of claim 12, wherein n=2.

14. The integrated circuit of claim 12, wherein said plurality of multiplex devices can couple said memory cell sensing system to any combination of said n control bit lines.

* * * * *